(12) United States Patent
Inui

(10) Patent No.: US 7,648,018 B2
(45) Date of Patent: Jan. 19, 2010

(54) ARTICLE TRANSPORT DEVICE

(75) Inventor: Yoshitaka Inui, Omihachiman (JP)

(73) Assignee: Daifuku Co., Ltd., Osaka (JP)

( * ) Notice: Subject to any disclaimer, the term of this patent is extended or adjusted under 35 U.S.C. 154(b) by 574 days.

(21) Appl. No.: 11/499,242

(22) Filed: Aug. 4, 2006

(65) Prior Publication Data

US 2007/0034477 A1 Feb. 15, 2007

(30) Foreign Application Priority Data

Aug. 10, 2005 (JP) ............................. 2005-232283

(51) Int. Cl.
*B65G 47/34* (2006.01)
*B65B 37/00* (2006.01)
(52) U.S. Cl. .............. 198/463.3; 198/346.2; 198/465.2; 198/474.1
(58) Field of Classification Search .............. 198/346.2, 198/347.4, 463.3, 465.2, 474.1, 795, 801
See application file for complete search history.

(56) References Cited

U.S. PATENT DOCUMENTS

| | | | |
|---|---|---|---|
| 4,597,708 A | | 7/1986 | Wheeler et al. |
| 4,736,787 A | * | 4/1988 | McMellon ................ 164/154.1 |
| 4,951,802 A | * | 8/1990 | Weissgerber et al. ..... 198/346.1 |
| 5,099,981 A | * | 3/1992 | Guzzoni ................... 198/346.1 |
| 5,299,680 A | * | 4/1994 | Rhodes .................... 198/465.2 |
| 5,826,692 A | * | 10/1998 | Blanc ....................... 198/346.1 |
| 6,199,679 B1 | * | 3/2001 | Heuft .......................... 198/415 |
| 6,209,194 B1 | * | 4/2001 | Kang et al. ................... 29/739 |
| 7,458,455 B2 | * | 12/2008 | Nakamura et al. ....... 198/463.3 |
| 2002/0044860 A1 | | 4/2002 | Hayashi et al. |
| 2004/0234360 A1 | | 11/2004 | Hayashi et al. |
| 2005/0036877 A1 | | 2/2005 | Ogawa et al. |

FOREIGN PATENT DOCUMENTS

| | | |
|---|---|---|
| JP | 2002-193096 | 7/2002 |
| WO | WO 00/37338 | 6/2000 |
| WO | WO 00/51921 | 9/2000 |
| WO | WO03/000472 | 1/2003 |

* cited by examiner

*Primary Examiner*—Douglas A Hess
(74) *Attorney, Agent, or Firm*—The Webb Law Firm

(57) ABSTRACT

An article transport device comprises an endless revolving body that is configured to move along a cyclic path in a substantially horizontal direction; a plurality of article supports each of which supports an article, wherein the article supports move together with the endless revolving body with the supports spaced apart from each other in a traveling direction; a support mechanism for supporting the article supports to the endless revolving body such that the article supports can move between a transport position adjacent the endless revolving body and an away position spaced apart from the transport position; and a guide mechanism for causing at least some of the article supports to move from the transport position to the away position and to move from the away position to the transport position, at an article delivering location or an article receiving location along the cyclic path of the endless revolving body.

20 Claims, 24 Drawing Sheets

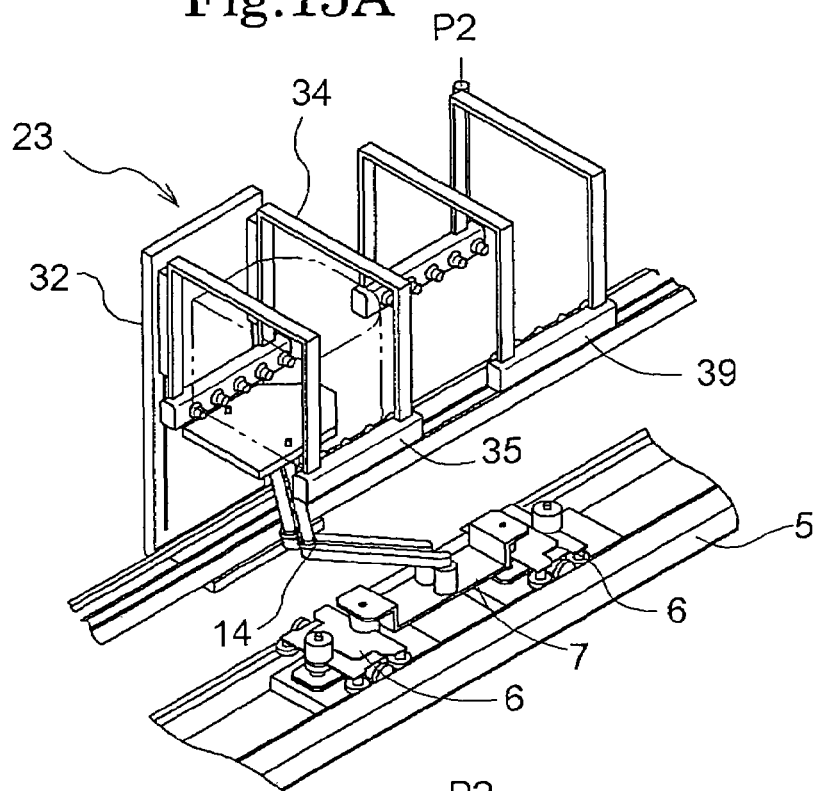
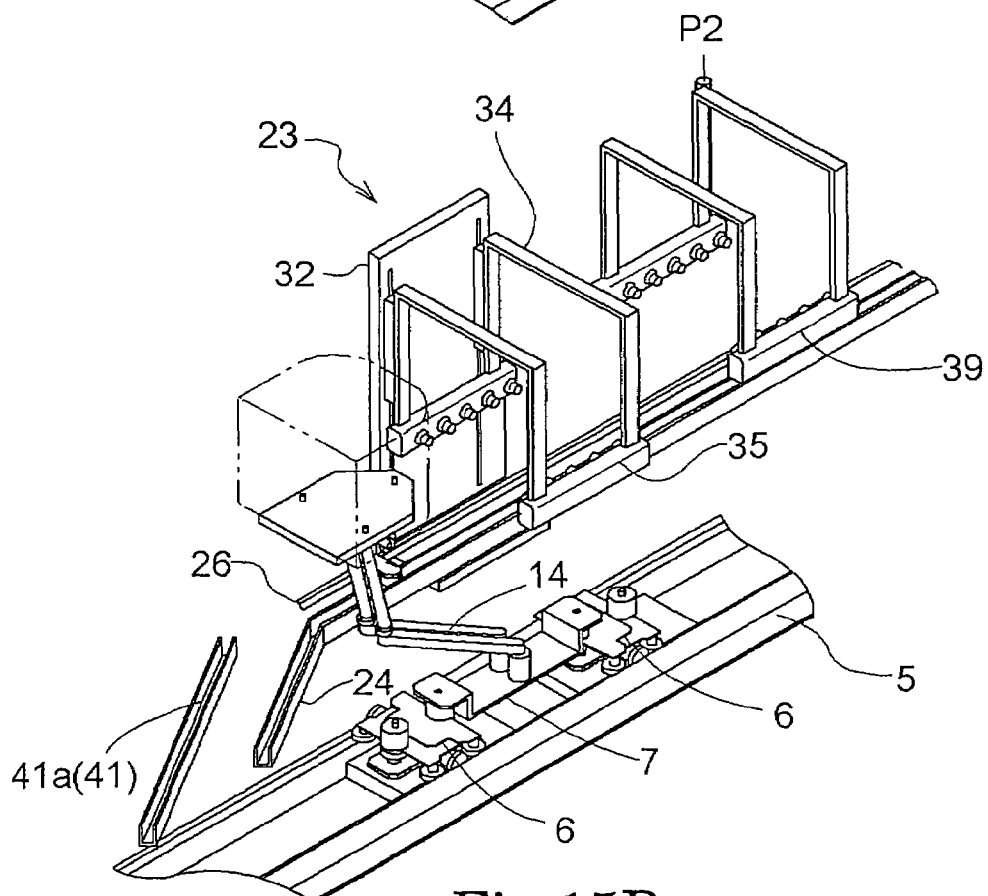

ARTICLE TRANSPORT DEVICE

BACKGROUND OF THE INVENTION

1. Field of the Invention

The present invention relates to article transport devices.

2. Description of Related Art

Article transport devices have an endless revolving body that is configured to move along a cyclic path in a substantially horizontal direction and a plurality of article supports each of which supports an article. The plurality of article supports move together with the endless revolving body with the supports spaced apart from each other in a traveling direction.

Such article transport devices are used for transporting articles such as transport containers that contain semiconductor substrates to and from various article handling facilities such as article storage facilities that store the articles.

A revolving path in the endless revolving body is provided with an article delivering location for delivering articles to an article handling facility and an article receiving location for receiving articles from an article handling facility.

For example, in such conventional article transport devices, article placing members are installed in a fixed manner on an endless revolving body, article transferring means is provided at an article delivering location and an article receiving location on the outer side of the endless revolving body, and when the article transferring means operates a placing portion on which an article is placed and supported, the article is transported between the article placing member and an article handling facility (see International Publication No. WO 03/000472, for example).

In these conventional article transport devices, when the article transferring means takes an article out of the article placing member at the article delivering location, first, the placing portion is moved in synchronization with the movement of the article placing member in a revolving direction of the endless revolving body. Next, in a state where the placing portion is moved in synchronization with the movement of the article placing member, the placing portion is projected below the article that is supported by the article placing member, and is then raised, so that the article is supported by the placing portion, and then the placing portion is withdrawn.

Furthermore, when the article transferring means loads an article onto the article placing member at the article receiving location, in a state where the placing portion is moved in synchronization with the movement of the article placing member, the placing portion is projected such that the article that is supported by the placing portion is positioned above the article placing member, then the placing portion is lowered, so that the article is loaded onto the article placing member, and then the placing portion is withdrawn.

After the article transferring means takes an article out of the article placing member at the article delivering location, the placing portion is moved, for example, the placing portion that supports the article is moved toward the article handling facility in order to transport the taken out article to the article handling facility, then the placing portion is moved to a start position for receiving a next article.

Furthermore, after the article transferring means loads an article onto the article placing member at the article receiving location, the placing portion is moved, for example, the placing portion is moved toward the article handling facility in order to receive an article from the article handling facility, then the placing portion is moved to a start position for moving the placing portion in synchronization with the movement of the article placing member when loading the article onto the article placing member at the article receiving location.

In this manner, in a state where the placing portion is moved in synchronization with the movement of the article placing member, when the placing portion is projected, vertically moved, and withdrawn by the article transferring means, articles are transported between the article placing member and the article handling facility without stopping the endless revolving body revolving in a circular manner while articles are transferred to and from the article placing member.

In these conventional article transport devices, at the article delivering location and the article receiving location, when the article transferring means takes an article out of the article placing member for transfer or loads an article onto the article placing member for transfer, the placing portion of the article transferring means is put on standby at a movement start position. When the article placing member for transfer reaches a position corresponding to the movement start position, the placing portion is projected toward the article placing member while the placing portion is moved in synchronization with the movement of the article placing member for transfer. Next, the placing portion is vertically moved, and an article is taken out of the article placing member or loaded onto the article placing member, and then the placing portion is withdrawn. At that time, the placing portion moves over a long distance in which the article placing member moves during the total time of a time necessary to project the placing portion, a time necessary to vertically move the placing portion, and a time necessary to withdraw the placing portion. Since it is necessary to move the placing portion over a long distance, the article transferring means has a large and complex configuration.

SUMMARY OF THE INVENTION

The present invention was arrived at in view of these points, and it is an object thereof to provide an article transport device with which the configuration for delivering an article at an article delivering location or receiving an article at an article receiving location can be made smaller and simpler.

In order to achieve the object described above, an article transport device comprises:

an endless revolving body that is configured to move along a cyclic path in a substantially horizontal direction;

a plurality of article supports each of which supports an article, wherein the article supports move together with the endless revolving body with the supports spaced apart from each other in a traveling direction;

support means for supporting the article supports to the endless revolving body such that the article supports can move between a transport position adjacent the endless revolving body and an away position spaced apart from the transport position; and guide means for causing at least some of the article supports to move from the transport position to the away position and to move from the away position to the transport position, at an article delivering location or an article receiving location along the cyclic path of the endless revolving body.

With the device according to the present invention, it is possible to make the configuration for delivering an article at an article delivering location or receiving an article at an article receiving location smaller and simpler than that of conventional devices.

BRIEF DESCRIPTION OF THE DRAWINGS

FIGS. 15A and 15B are perspective views showing the operation of the article delivering means.

DETAILED DESCRIPTION OF PREFERRED EMBODIMENTS

Hereinafter, preferred embodiments of the present invention are described based on the appended drawings.

Embodiments of an article transport device according to the present invention are described based on the drawings.

First Embodiment

First, a first embodiment is described.

Figure 1:
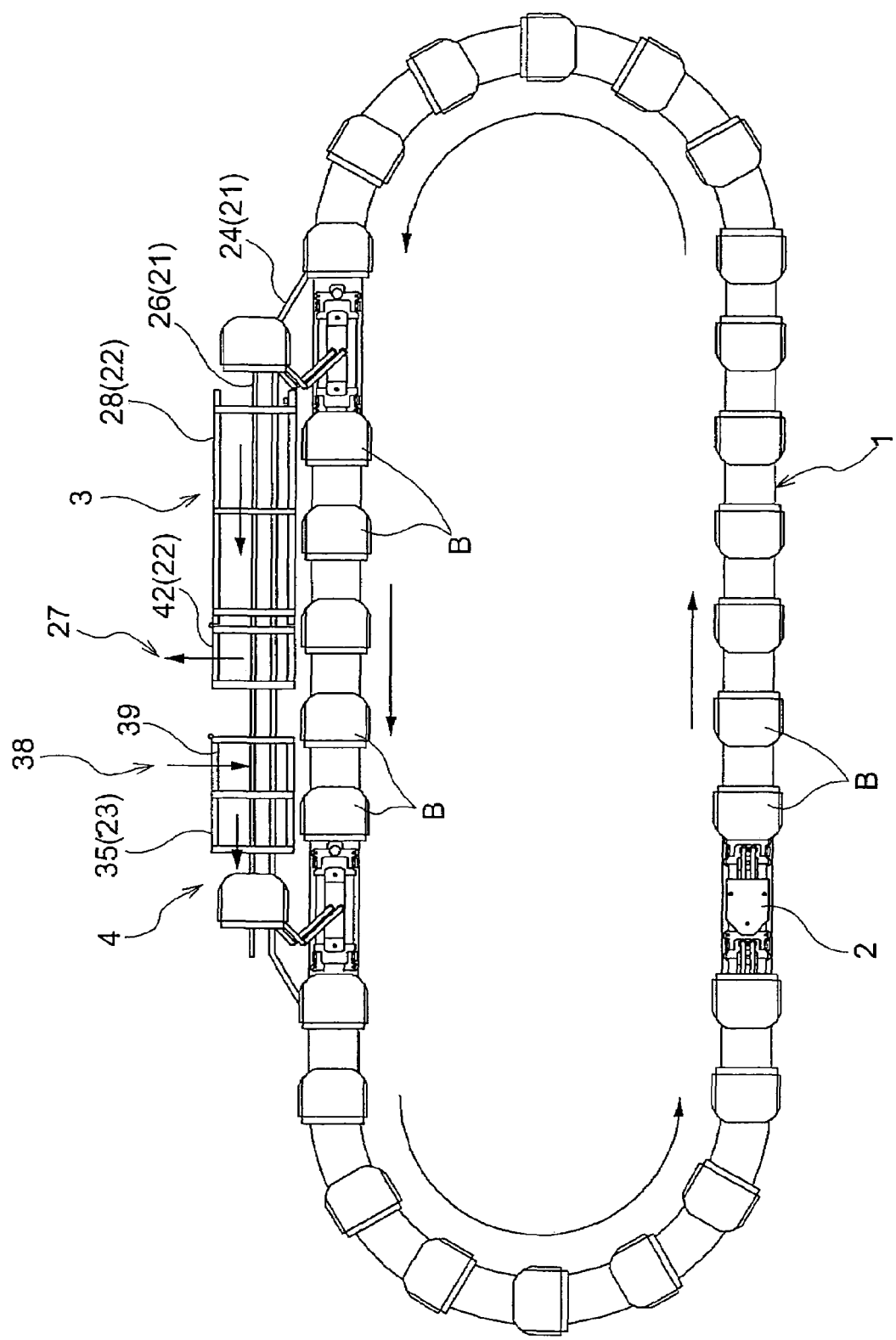
FIG. 1 is an overall plan view of an article transport device.
Figure 2:
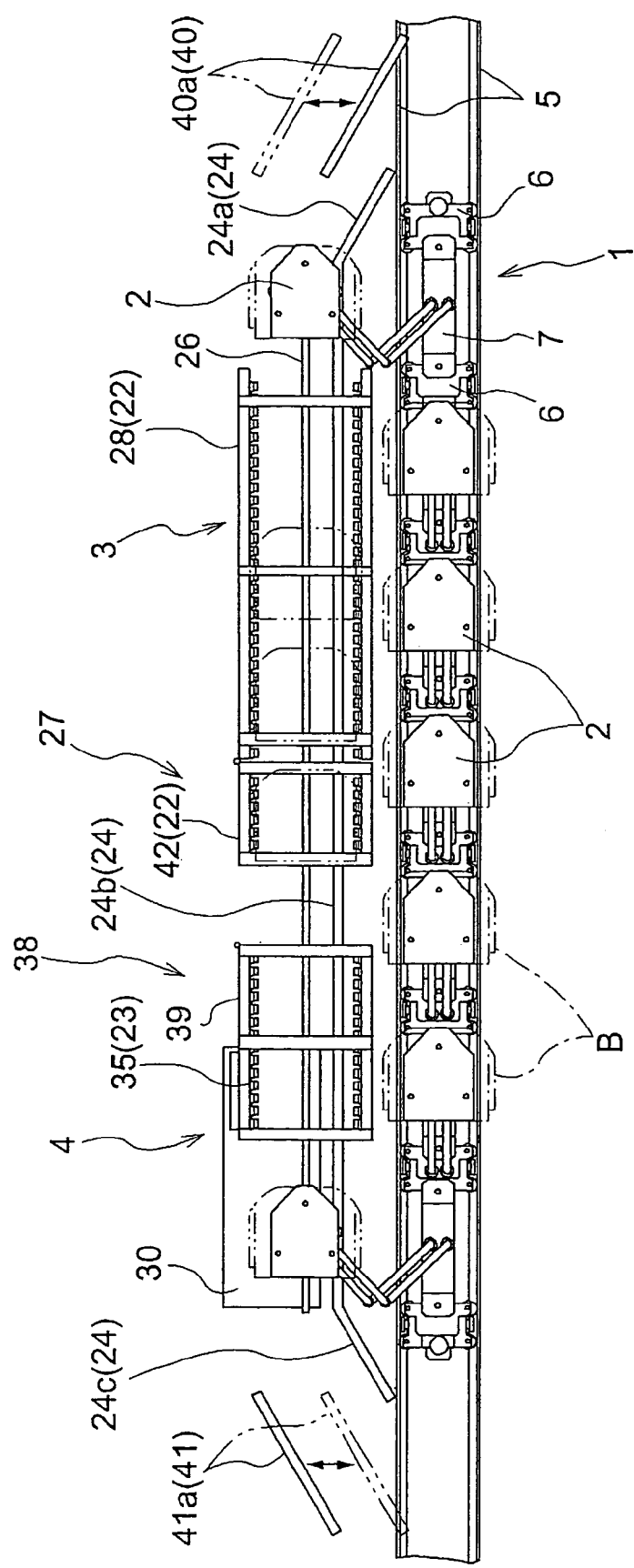
FIG. 2 is a plan view showing the main portions of the article transport device.
Figure 3:
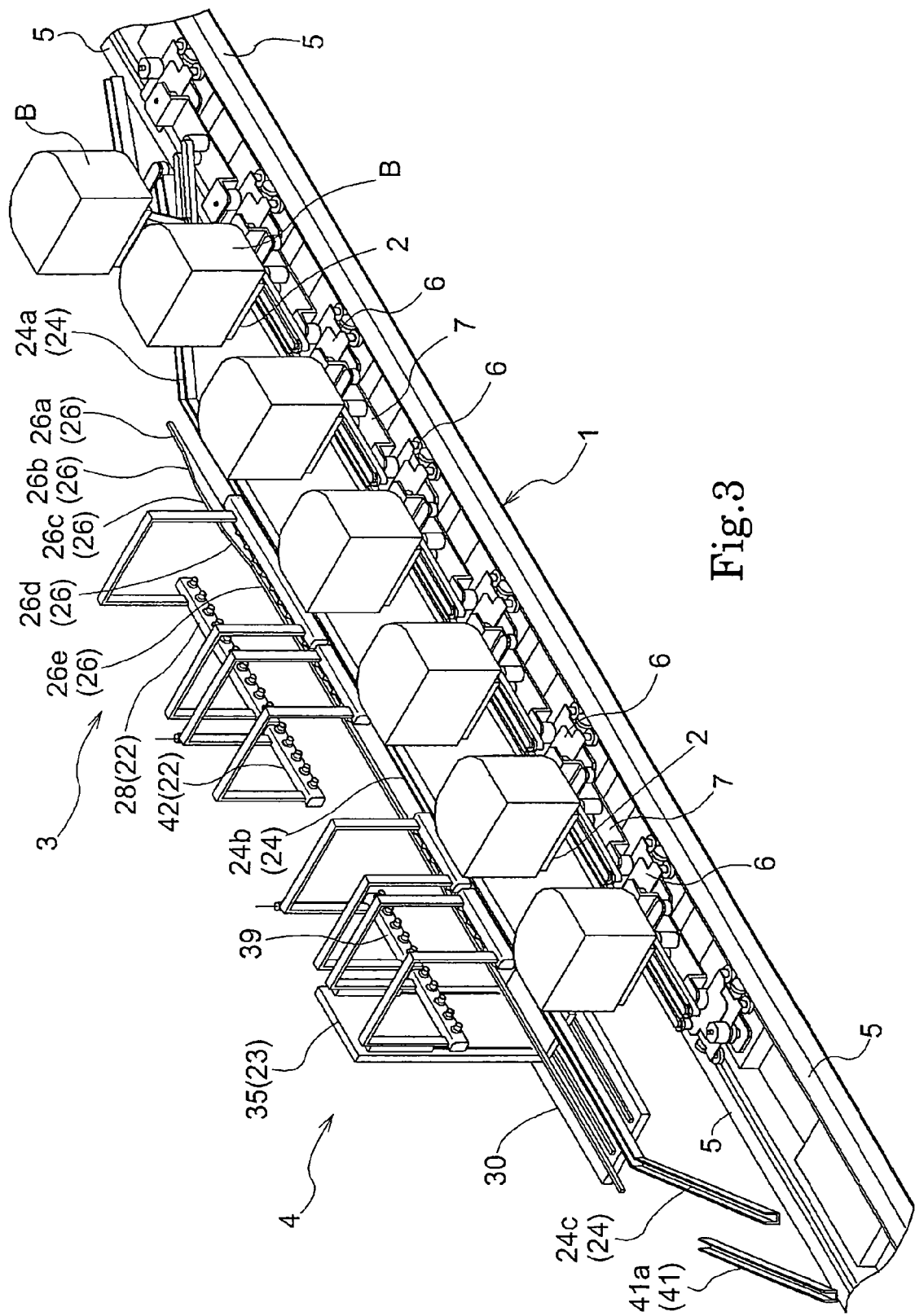
FIG. 3 is a perspective view showing the main portions of the article transport device.

As shown in FIGS. 1 to 3, an article transport device of the first embodiment is constituted by a plurality of article placing members 2 (article supports) on which articles B are placed and supported, and an endless revolving body 1 that revolves in a circular manner in the horizontal direction or a substantially horizontal direction. The article placing members 2 are aligned apart from each other in the longitudinal direction of the endless revolving body 1, and move together with the endless revolving body 1.

FIG. 1 is an overall plan view of the article transport device. FIG. 2 is a plan view showing the main portions of the article transport device. FIG. 3 is a perspective view showing the main portions of the article transport device.

A revolving path of the endless revolving body 1 is provided with an article delivering location 3 for delivering articles B to various article handling facilities such as an article storage facility that stores articles B, and an article receiving location 4 for receiving articles B from an article handling facility, for example. In this embodiment, the article delivering location 3 is positioned on the upstream side of the article receiving location 4 in a revolving direction (direction of the arrow in FIG. 1) of the endless revolving body 1, and the article delivering location 3 and the article receiving location 4 are arranged adjacent to each other.

The article delivering location 3 is provided with a receiving roller conveyer (article-receiving placing portion) 28 to which articles B are delivered from the article placing members 2. The receiving roller conveyer 28 is configured so as to transport articles B that have been delivered from the article placing members 2, in the horizontal direction or a substantially horizontal direction from the article delivering location 3 to an article take-out location 27.

Furthermore, a take-out roller conveyer 42 that transports articles B from the receiving roller conveyer 28 to the article take-out location 27 is provided.

In this manner, article-placing transport means 22 for transporting articles B that are positioned at the article delivering location 3 to which articles B are delivered from the article placing members 2, in the horizontal direction or a substantially horizontal direction to the article take-out location 27 is constituted by the receiving roller conveyer 28 and the take-out roller conveyer 42.

The article take-out location 27 is a location for taking articles B out of the article transport device to the article handling facility, where for example an article transfer device installed on the side of the article handling facility takes out articles B that have been transported to the article take-out location 27.

The article receiving location 4 is provided with a delivering roller conveyer (article-receiving placing portion) 35 on which articles B are placed and supported, and article delivering means 23 for delivering articles B from the delivering roller conveyer 35 to the article placing members 2.

Furthermore, a take-in roller conveyer 39 that transports articles B from an article take-in location 38 to the delivering roller conveyer 35 of the article delivering means 23 is provided.

The article take-in location 38 is a location for taking articles B from the article handling facility to the article transport device, where for example an article transfer device installed on the side of the article handling facility transfers articles B to the take-in roller conveyer 39.

The receiving roller conveyer 28, the take-out roller conveyer 42, the take-in roller conveyer 39, and the delivering roller conveyer 35 are aligned on a straight line in parallel with the revolving direction of the endless revolving body 1, on the outer side of the endless revolving body 1.

As shown in FIGS. 2 and 3, all of the receiving roller conveyer 28, the take-out roller conveyer 42, the take-in roller conveyer 39, and the delivering roller conveyer 35 have a prescribed spacing between their left and right rollers such that the article placing members 2 can be positioned between the left and right rollers, and transport articles B in a state where both end portions of the articles B are placed and supported on the left and right rollers.

In this manner, articles B are transported along a cyclic transport path while being placed and supported on the article placing members 2. The articles B are taken out of the article placing members 2 onto the receiving roller conveyer 28 at the article delivering location 3. Then, the articles B are transported on the receiving roller conveyer 28 and the take-out roller conveyer 42 to the article take-out location 27. Furthermore, articles B that have been taken in at the article take-in location 38 are transported from the take-in roller conveyer 39 to the delivering roller conveyer 35 of the article delivering means 23. The articles B are loaded by the article delivering means 23 from the delivering roller conveyer 35 onto the article placing members 2 at the article receiving location 4, and are transported along the cyclic transport path while being placed and supported on the article placing members 2.

The endless revolving body 1 is constituted by a plurality of travel members 6 (vehicles) that are guided by a pair of outer and inner guide rails 5, and a plurality of coupling members 7 that couple the travel members 6.

As shown in FIGS. 4 to 7, one travel member 6 is configured by combining two plate members, and each of the plurality of travel members 6 is provided with a plurality of travel rollers 8 that can rotate about horizontal axes and a plurality of vibration-preventing rollers 9 that can rotate about vertical axes. On the guide rails 5, travel guide faces 5a that guide the travel rollers 8 and vibration-preventing guide faces 5b that guide the vibration-preventing rollers 9 are formed.

Figure 4A:
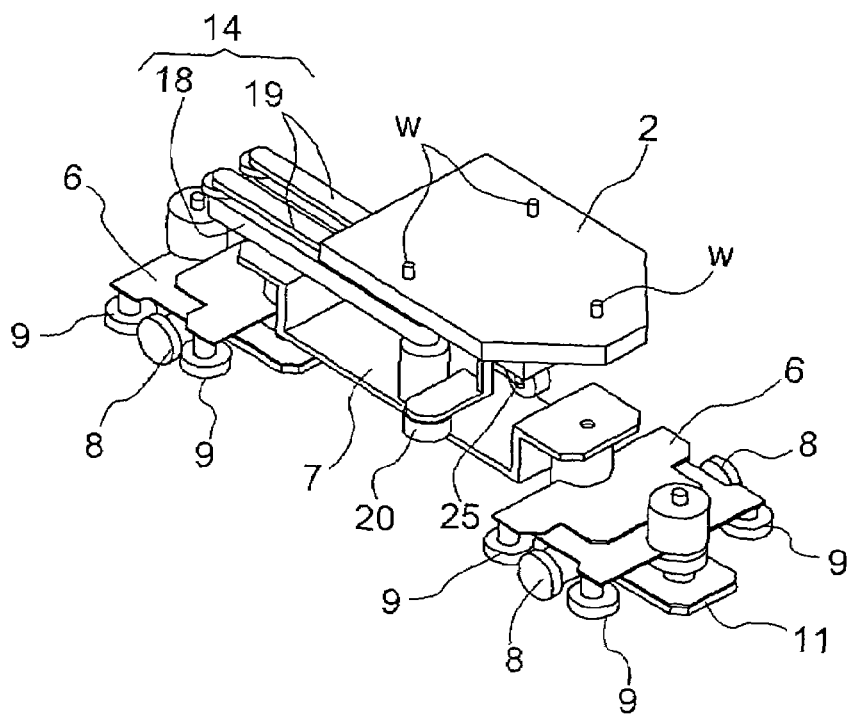
FIGS. 4A and 4B are perspective views showing the main portions of an endless revolving body.
Figure 4B:
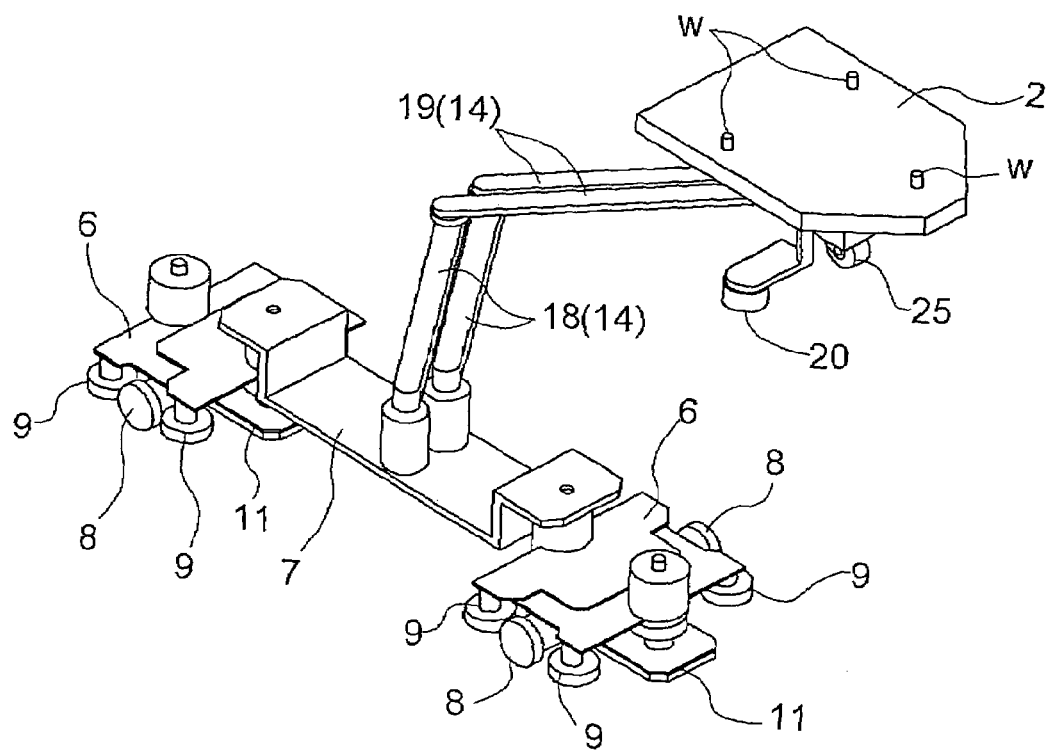
Figure 5:
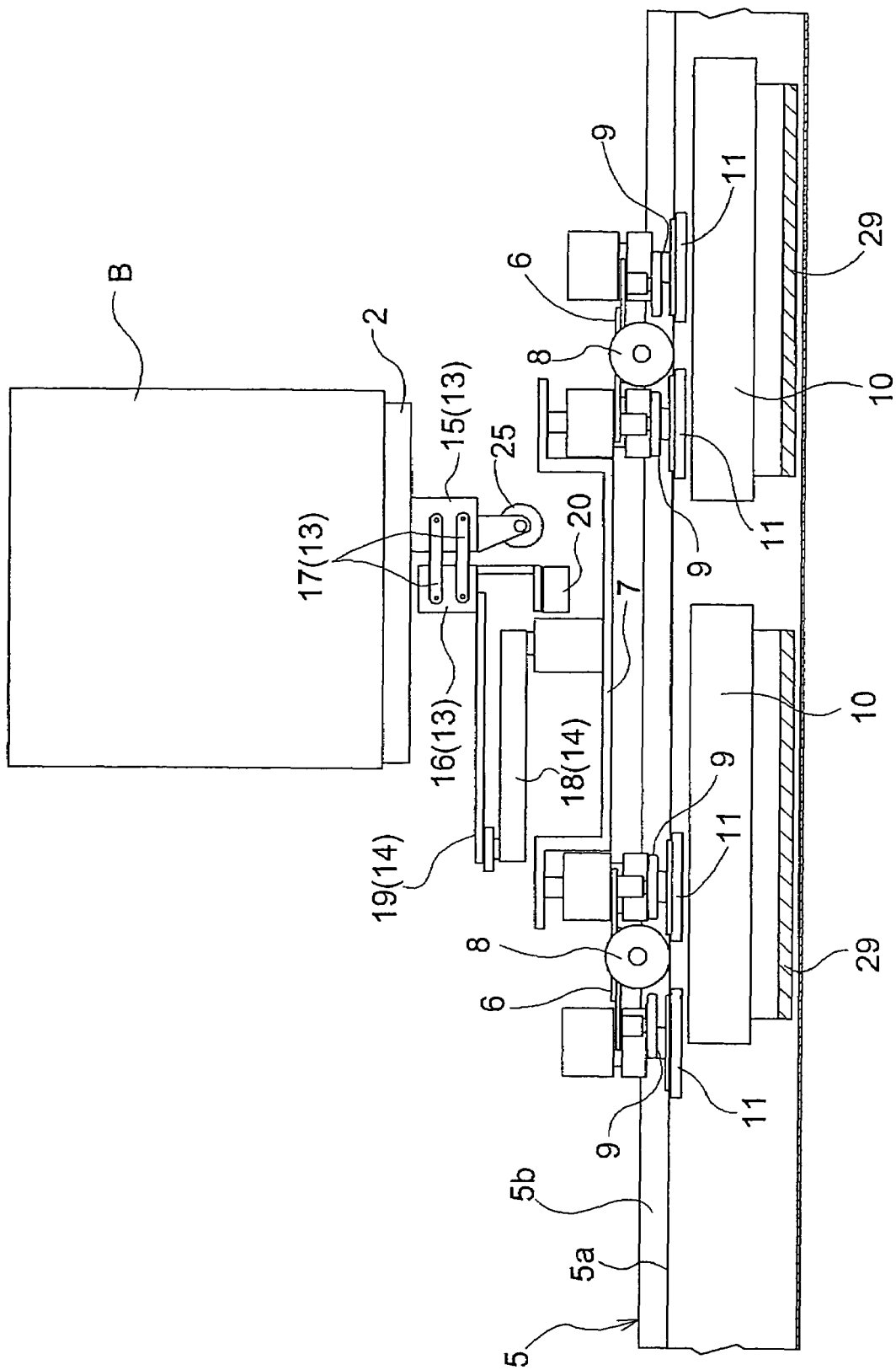
FIG. 5 is a side cross-sectional view showing the main portions of the endless revolving body.
Figure 6:
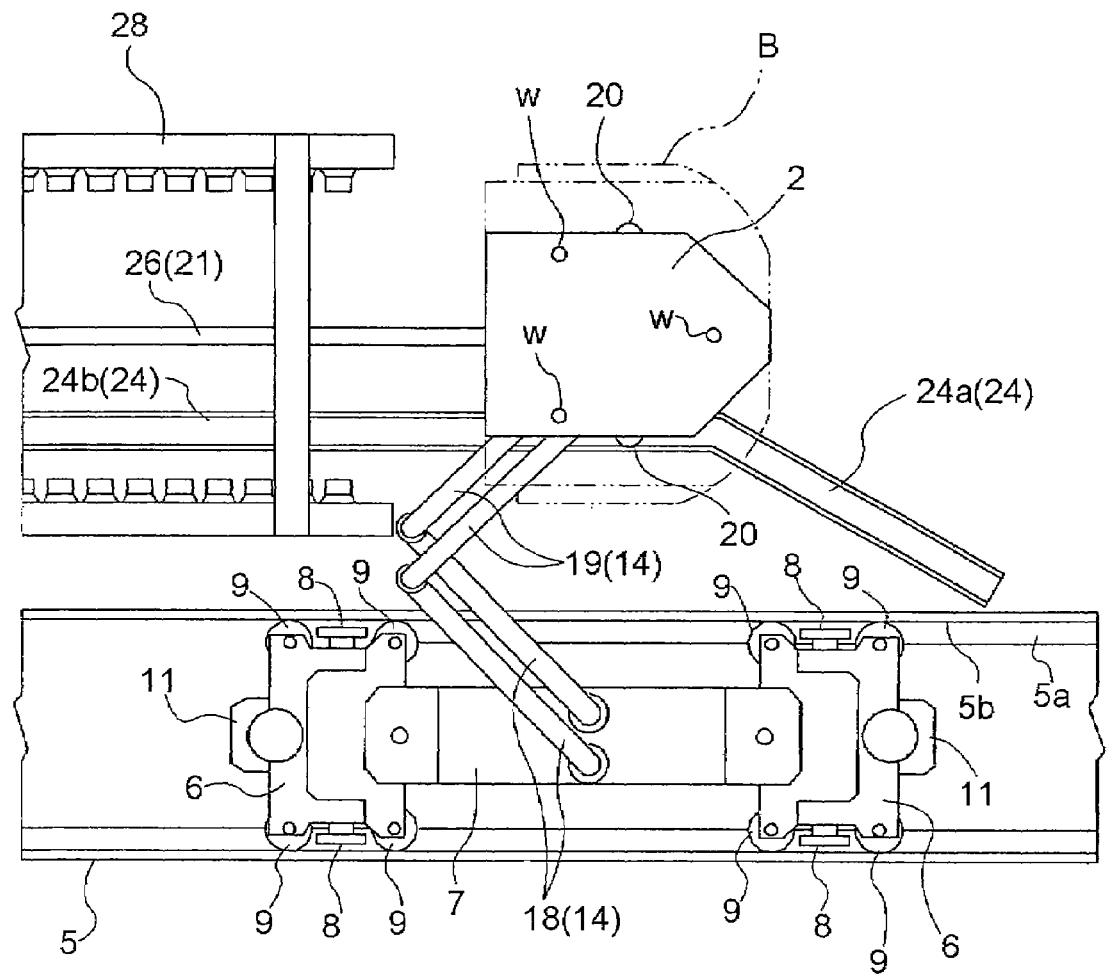
FIG. 6 is a plan view showing the main portions of the endless revolving body.
Figure 7:
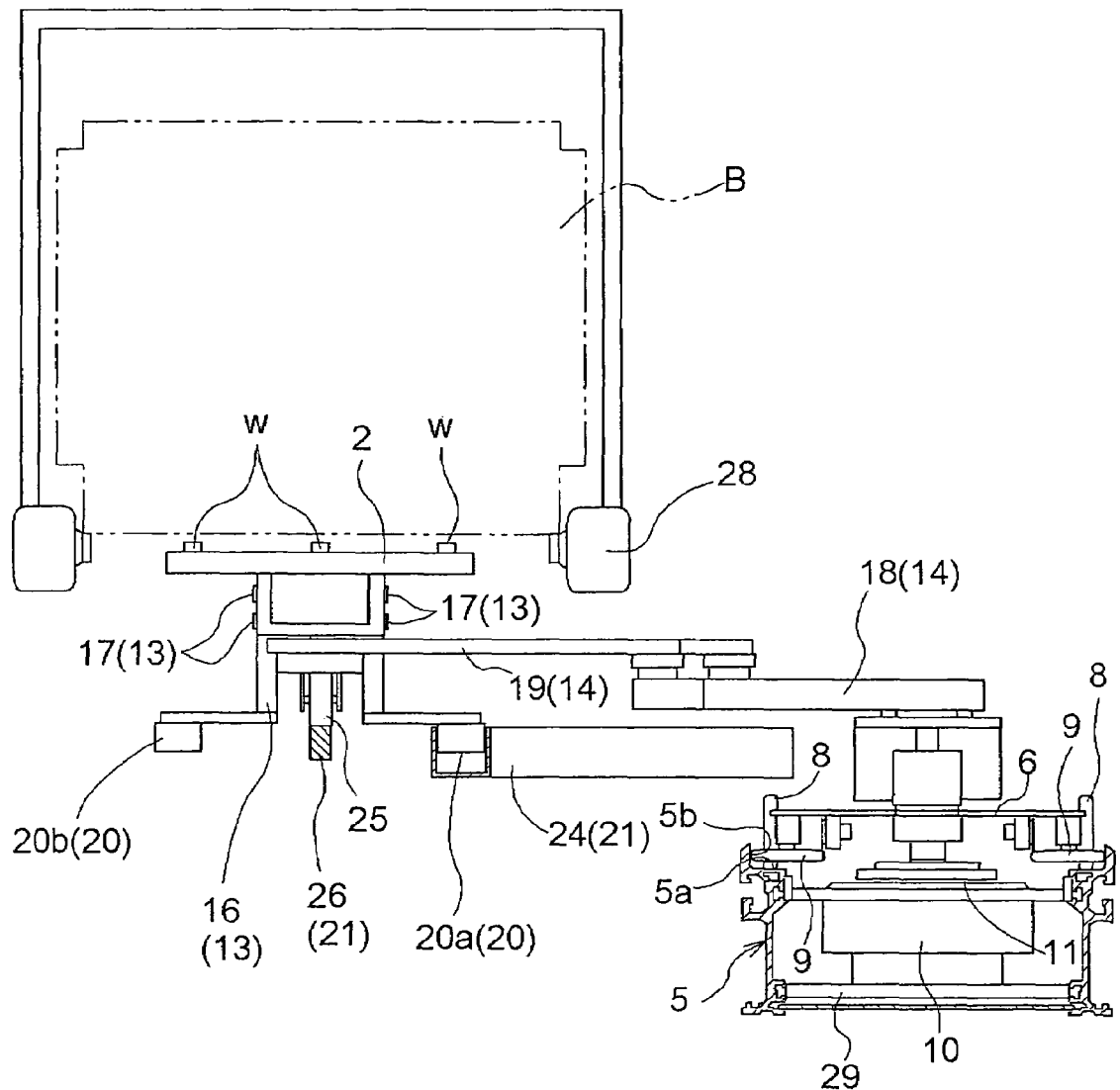
FIG. 7 is a cross-sectional view of the endless revolving body viewed from a direction opposite to the revolving direction.

FIGS. 4A and 4B are perspective views showing the main portions of the endless revolving body 1. FIG. 5 is a side cross-sectional view showing the main portions of the endless revolving body 1. FIG. 6 is a plan view showing the main portions of the endless revolving body 1. FIG. 7 is a cross-sectional view of the endless revolving body 1 viewed from a direction opposite to the revolving direction of the endless revolving body 1.

The endless revolving body 1 is driven to revolve in the longitudinal direction by the driving force obtained from linear motors constituted by magnets 10 and primary coils 11. The plurality of magnets 10 are arranged apart from each other in the longitudinal direction of the guide rails 5. The plurality of magnets 10 are respectively supported by magnet support brackets 29 that are attached to the guide rails 5. The primary coils 11 are provided on lower face portions of the travel members 6 such that the primary coils 11 are closely opposed to the magnets 10.

Each of the plurality of coupling members 7 is provided with one article placing member 2 in the shape of a plate having a width shorter than the width of an article B, and support means for moving the article placing member for supporting the article placing member 2.

The support means for moving the article placing member is configured so as to support the article placing member 2 with respect to the endless revolving body 1 such that the article placing member 2 can move between a transport position shown in FIG. 4A and an away position shown in FIG. 4B and can vertically move while being kept at an article-placing posture.

The article-placing posture is a horizontal direction or a substantially horizontal posture, and is a posture at which an article B is supported and placed while keeping the posture thereof horizontal or substantially horizontal. An article B that is placed and supported on the article placing member 2 is placed and supported while its position is fixed by positioning pins W (positioning members) that vertically extend.

The transport position is a position above the coupling member 7 on the endless revolving body 1, and is a position at which the article placing member 2 is positioned close to the endless revolving body 1.

As shown in FIGS. 6 and 7, the away position is a position spaced away from the transport position in the horizontal direction on the outer side of the endless revolving body 1, and is a position at which the article placing member 2 is positioned outside an article-transporting space that is occupied by articles B that are placed and supported on the article placing members 2 at the transport positions as the transportation progresses. As shown in FIGS. 2 and 3, the receiving roller conveyer 28, the take-out roller conveyer 42, the take-in roller conveyer 39, and the delivering roller conveyer 35 are arranged corresponding to the away positions.

The support means for moving the article placing member is constituted by elevation support means 13 (first means) for supporting the article placing member 2 in a vertically movable manner, and support means 14 for moving the elevation support means (second means) for supporting the elevation support means 13 in a movable manner with respect to the endless revolving body 1 such that the article placing member 2 is supported in a movable manner between the transport position and the away position with respect to the endless revolving body 1.

The following is a description concerning the elevation support means 13 (first means). As shown in FIGS. 5 and 7, the elevation support means 13 is configured so as to support an extension member 15 that is coupled into the article placing member 2, in a vertically movable manner with respect to a base member 16 while keeping the posture of the extension member 15. The elevation support means 13 is constituted by a parallel link mechanism provided with four upper and lower left and right elevation link arms 17 that are coupled into the extension member 15 pivotably about horizontal axes and that are coupled into the base member 16 pivotably about horizontal axes.

The extension member 15 has a shape that extends downward from the center position or a substantially center position of the article placing member 2, and is provided so as to move together with the article placing member 2 in the horizontal direction and the vertical direction. The base member 16 has a shape that extends in the vertical direction in a state where it is opposed to the extension member 15, and is provided so as to move together with the article placing member 2 in the horizontal direction.

Next, the support means 14 for moving the elevation support means (second means) is described. As shown in FIGS. 4 to 7, the second means 14 is configured so as to support the base member 16 in a horizontally movable manner with respect to the coupling member 7 while keeping the posture of the base member 16. The second means 14 is constituted by a parallel link mechanism pivotally coupling a pair of first link arms 18 that are coupled into the coupling member 7 pivotably about vertical axes and a pair of second link arms 19 that are coupled into the base member 16 pivotably about vertical axes.

Guide means 21 for guiding a guided portion that is provided so as to move together with the article placing member 2 is provided such that the article placing member 2 for transfer among the plurality of article placing members 2 is moved from the transport position to the away position and moved from the away position to the transport position at the article delivering location 3 and the article receiving location 4.

The guide means 21 is configured so as to vertically move the article placing member 2 for transfer that is positioned at the away position at the article delivering location 3 such that an article B supported on the article placing member 2 for transfer that is positioned at the away position at the article delivering location 3 is delivered to the receiving roller conveyer 28 by lowering the article placing member 2 from a position above the receiving roller conveyer 28.

The article placing members 2 on which articles B that are to be delivered at the article delivering location 3 are placed and supported, and the empty article placing members 2 that are to receive articles B at the article receiving location 4 are taken as the article placing members 2 for transfer.

In this manner, the guide means 21 is configured to move the article placing member 2 in the horizontal direction between the transport position and the away position, and to vertically move the article placing member 2 that is positioned at the away position in the vertical direction between positions above and below the receiving roller conveyer 28. It should be noted that the positions above and below the receiving roller conveyer 28 are determined taking the rollers of the receiving roller conveyer 28 as a reference, and for example, a position above the receiving roller conveyer 28 refers to a position above the rollers of the receiving roller conveyer 28.

The guide means 21 is constituted by a guide rail 24 (movement guide member) that guides a horizontal guide roller 20 provided so as to move together with the article placing member 2 such that the article placing member 2 is moved between the transport position and the away position, and an elevation rail 26 (elevation guide member) that guides an elevation guide roller 25 provided so as to vertically move together with the article placing member 2 such that the article placing member 2 that is positioned at the away position at the article delivering location 3 is vertically moved.

First, a configuration is described in which the article placing member 2 is moved between the transport position and the away position when the guide rail 24 guides the horizontal guide roller 20.

As shown in FIG. 7, two horizontal guide rollers 20 are provided on the left side and the right side viewed from a direction opposite to the revolving direction of the endless revolving body 1. Each of the two horizontal guide rollers 20 is provided in a revolvable manner about a vertical axis with respect to the base member 16. The base member 16 has a shape in which a portion lower than an upper portion coupled into the elevation link arms 17 is branched into two lower portions, and the branched front end portions are respectively provided with the horizontal guide rollers 20.

In this embodiment, when viewed from a direction opposite to the revolving direction of the endless revolving body 1, the horizontal guide roller 20 that is positioned on the right side (inner side with respect to the endless revolving body 1) is referred to as a first horizontal guide roller 20a, and the horizontal guide roller 20 that is positioned on the left side (outer side with respect to the endless revolving body 1) is referred to as a second horizontal guide roller 20b.

As shown in FIGS. 2, 3, and 6, the guide rail 24 is in the shape of a recessed groove that guides the horizontal guide roller 20 in the horizontal direction, and is disposed on the outer side of the endless revolving body 1. The guide rail 24 is constituted by a fork portion 24a that extends away from the endless revolving body 1 obliquely to the outer side, an away portion 24b that is in parallel with the revolving direction of the endless revolving body 1 with a spacing interposed therebetween in the horizontal direction, and a merging portion 24c that extends closer to the endless revolving body 1 obliquely to the inner side. Furthermore, the guide rail 24 is configured so as to guide the first horizontal guide roller 20a among the two horizontal guide rollers 20.

When the fork portion 24a of the guide rail 24 guides the first horizontal guide roller 20a, the article placing member 2 for transfer is moved from the transport position to the away position at a location before the article delivering location 3. When the away portion 24b of the guide rail 24 guides the first horizontal guide roller 20a, the article placing member 2 for transfer is positioned at the away positions at the article delivering location 3 and the article receiving location 4. When the merging portion 24c of the guide rail 24 guides the first horizontal guide roller 20a, the article placing member 2 for transfer that has passed the article receiving location 4 is moved from the away position to the transport position.

In this manner, when the guide rail 24 guides the first horizontal guide roller 20a, the article placing member 2 for transfer is moved from the transport position to the away position a location before the article delivering location 3, the article placing member 2 for transfer is positioned at the away positions at the article delivering location 3 and the article receiving location 4, and the article placing member 2 for transfer that has passed the article receiving location 4 is moved from the away position to the transport position.

One guide rail 24 serves as both guide means corresponding to the article delivering location 3 for moving the article placing member 2 for transfer from the transport position to the away position at the article delivering location 3, and guide means corresponding to the article receiving location 4 for moving the article placing member 2 for transfer from the away position to the transport position at the article receiving location 4.

The article placing member 2 for transfer is moved from the transport position to the away position along the guide rail 24, and thus the article placing member 2 is positioned at the away positions at the article delivering location 3 and the article receiving location 4. Herein, the article placing members 2 other than the article placing member 2 for transfer are kept such that the article placing members 2 are at the transport positions at the article delivering location 3 and the article receiving location 4.

Thus, when the article placing member 2 is positioned at a fork-middle position between the transport position and the away position, the guide rail 24 guides the first horizontal guide roller 20a, and thus the article placing member 2 is moved from the fork-middle position to the away position, and when the article placing member 2 is positioned at the transport position, the guide rail 24 does not guide the first horizontal guide roller 20a, an thus the article placing member 2 is kept at the transport position.

Furthermore, a location before the guide rail 24 guides the first horizontal guide roller 20a in the revolving direction of the endless revolving body 1 is provided with fork-switching means 40 capable of switching between a fork state in which the article placing member 2 that is positioned at the transport position is moved to the fork-middle position, and a non-fork state in which the article placing member 2 that is positioned at the transport position is kept at the transport positions.

The fork-switching means 40 is constituted by a fork guide rail 40a that can horizontally move between a guide position (solid line in FIG. 2) at which the article placing member 2 that is positioned at the transport position is moved from the transport position to the fork-middle position, and a non-guide position (broken line in FIG. 2).

The guide position is a position for guiding the second horizontal guide roller 20b with the fork guide rail 40a, by positioning the front end portion of the fork guide rail 40a at a position through which the second horizontal guide roller 20b on the article placing member that is positioned at the transport position passes.

The non-guide position is a position for letting the second horizontal guide roller 20b on the article placing member that is positioned at the transport position pass by, by withdrawing the front end portion of the fork guide rail 40a to the outer side of the position through which the second horizontal guide roller 20b on the article placing member that is positioned at the transport position passes.

Figure 8A:
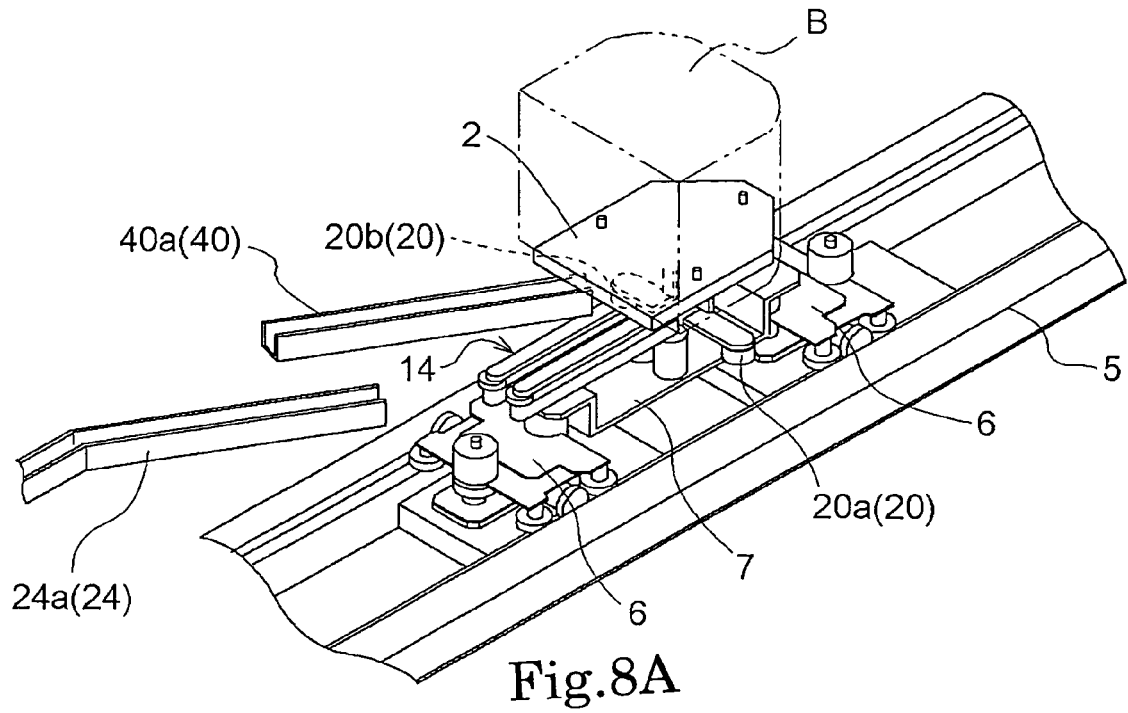
FIGS. 8A and 8B are perspective views showing the operation of an article placing member.
Figure 8B:
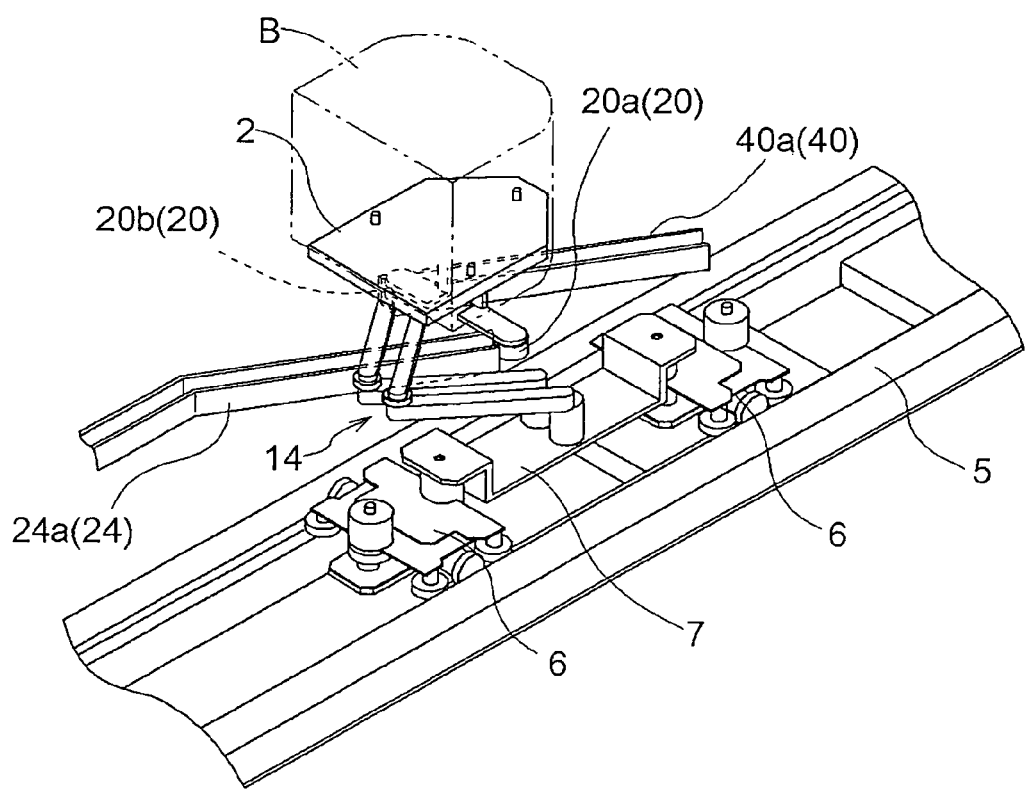
Figure 9A:
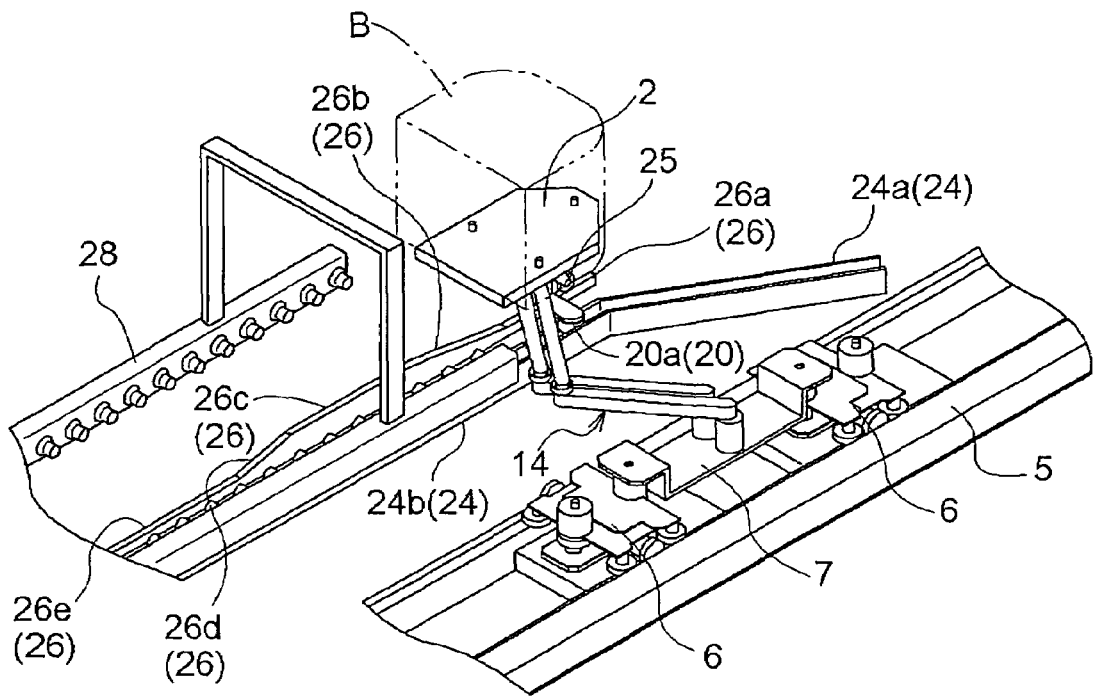
FIGS. 9A and 9B are perspective views showing the operation of the article placing member.

When the fork-switching means 40 switches the state to the fork state by positioning the fork guide rail 40a at the guide position as shown in FIG. 8A, the second horizontal guide roller 20b is guided by the fork guide rail 40a, and the article placing member 2 that is positioned at the transport position is moved to the fork-middle position as shown in FIG. 8B. Accordingly, the first horizontal guide roller 20a is guided by the guide rail 24, and the article placing member 2 that is positioned at the fork-middle position is moved to the away position as shown in FIG. 9A. In this manner, the article placing member 2 is positioned at the away positions at the article delivering location 3 and the article receiving location 4.

Furthermore, although not shown, when the fork-switching means 40 switches the state to the non-fork state by positioning the fork guide rail 40a at the non-guide position, the second horizontal guide roller 20b is not guided by the fork guide rail 40a, and the article placing member 2 that is positioned at the transport position is kept at the transport positions. Since the first horizontal guide roller 20a is not guided by the guide rail 24 either, the article placing member 2 that is positioned at the transport position is kept at the transport positions. In this manner, the article placing member 2 is positioned at the transport positions at the article delivering location 3 and the article receiving location 4.

Furthermore, the fork-switching means 40 is configured so as to usually keep the state at the non-fork state by positioning the fork guide rail 40a at the non-guide position, and to switch the state to the fork state by horizontally moving the fork guide rail 40a from the non-guide position to the guide position using a fork-movable guide 40b only when the article placing member 2 for transfer approaches.

At the article receiving location 4, when the article placing member 2 that is positioned at the away position passes and then the article placing member 2 is moved from the away position to the transport position, it is necessary for the guide rail 24 to guide the first horizontal guide roller 20a without preventing the movement of the article placing members 2 that are positioned at the transport positions.

As shown in FIGS. 2 and 3, the rear end portion of the merging portion 24c of the guide rail 24 is positioned on the outer side of the endless revolving body 1 with respect to the article placing members 2 that are positioned at the transport positions, so that the guide rail 24 does not prevent the movement of the article placing members 2 that are positioned at the transport positions. With this configuration, when the merging portion 24c of the guide rail 24 guides the first horizontal guide roller 20a, the article placing member 2 that is positioned at the away position is not moved further than a merging-middle position between the away position and the transport position.

Thus, a location at which the merging portion 24c of the guide rail 24 ends the guiding of the first horizontal guide roller 20a is provided with merging-switching means 41 capable of switching between a merging state in which the article placing member 2 that is positioned at the merging-middle position is moved to the transport position, and a withdrawn state in which withdrawal is performed so as not to prevent the movement of the article placing members 2 that are positioned at the transport positions.

The merging-switching means 41 is constituted by a merging guide rail 41a that can horizontally move between a guide position (broken line in FIG. 2) at which the article placing member 2 that is positioned at the merging-middle position is moved from the merging-middle position to the transport position, and a withdrawn position (solid line in FIG. 2).

Figure 10A:
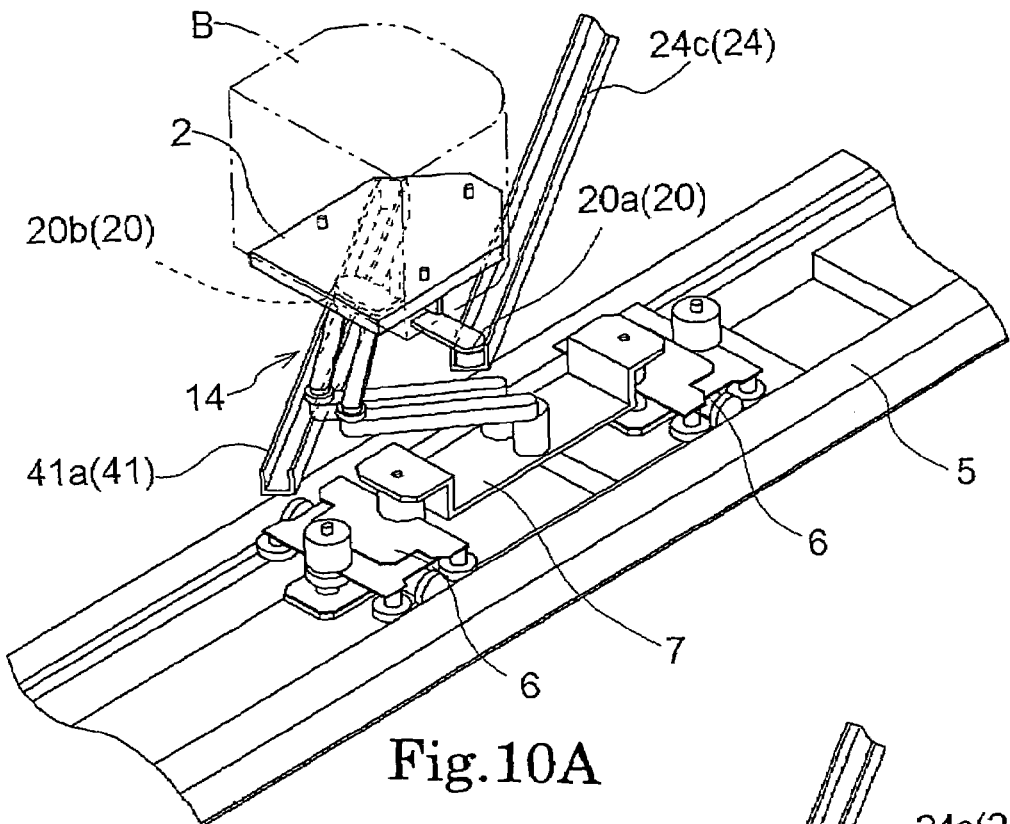
FIGS. 10A and 10B are perspective views showing the operation of the article placing member.
Figure 10B:
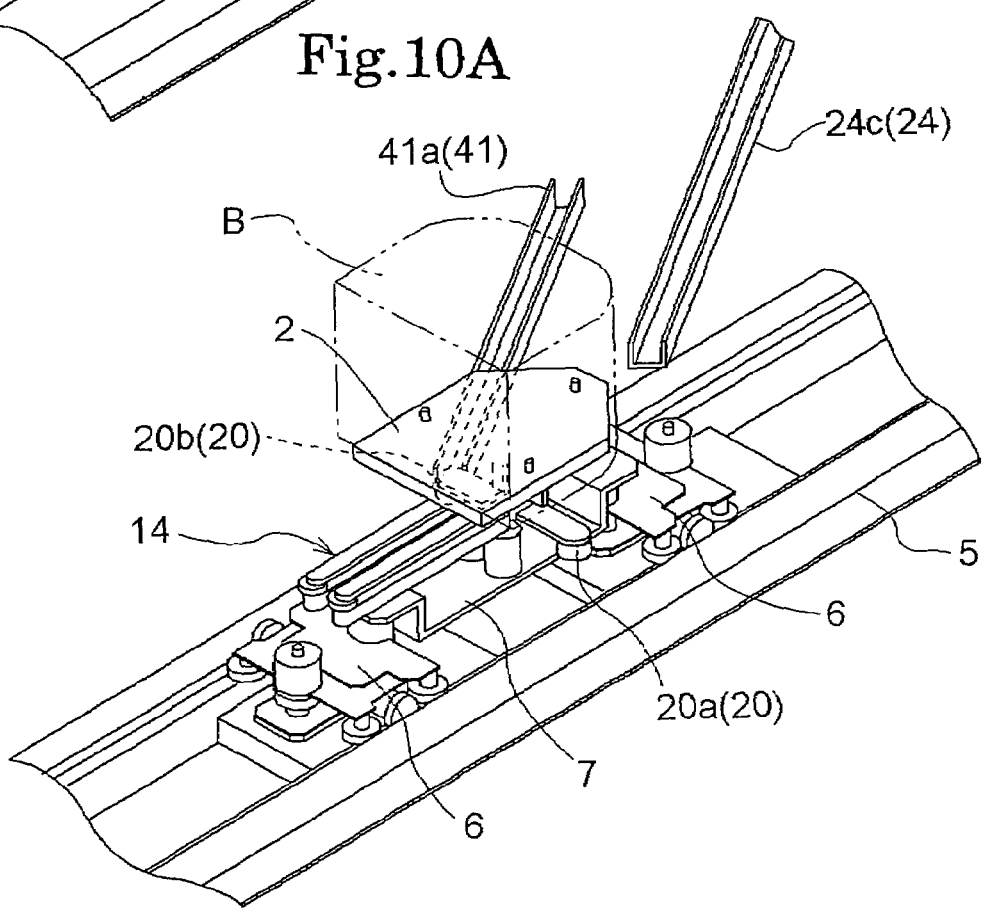

As shown in FIGS. 10A and 10B, the guide position is a position for moving the article placing member 2 to the transport position, by projecting the rear end portion of the merging guide rail 41a to the endless revolving body 1, thereby guiding the merging guide rail 41a with the second horizontal guide roller 20b.

The withdrawn position is a position for not preventing the movement of the following article placing members 2 that are positioned at the transport positions, by positioning the rear end portion of the merging guide rail 41a on the outer side of the endless revolving body 1, thereby not letting the merging guide rail 41a interfere with the article placing members 2 that are positioned at the transport positions.

The merging-switching means 41 is configured so as to switch the state to the merging state by positioning the merging guide rail 41a at the guide position, and to switch the state to the withdrawn state by positioning the merging guide rail 41a at the withdrawn position.

Furthermore, the merging-switching means 41 is configured so as to usually keep the state at the withdrawn state by positioning the merging guide rail 41a at the withdrawn position, and to switch the state to the merging state by horizontally moving the merging guide rail 41a from the withdrawn position to the guide position using a merging-movable guide 41b only when the article placing member 2 that is positioned at the away position approaches.

Next, a configuration is described in which the elevation rail 26 guides the elevation guide roller 25, and thus the article placing member 2 that is positioned at the away position is vertically moved.

As shown in FIGS. 5 and 7, the elevation guide roller 25 is disposed below the extension member 15 so as to be at the center position or a substantially center position of the article placing member 2, and is disposed in a revolvable manner about a horizontal axis.

As shown in FIGS. 2, 3, 6, and 7, the elevation rail 26 is for guiding the elevation guide roller 25 on the article placing member 2 that is positioned at the away position. When viewed from above, the elevation rail 26 is in the shape of a straight line that is longer than the entire length of the receiving roller conveyer 28, the take-out roller conveyer 42, the take-in roller conveyer 39, and the delivering roller conveyer 35 that are arranged corresponding to the away positions, and is disposed so as to be at the center position or a substantially center position of these roller conveyers in the horizontal direction.

Figure 11A:
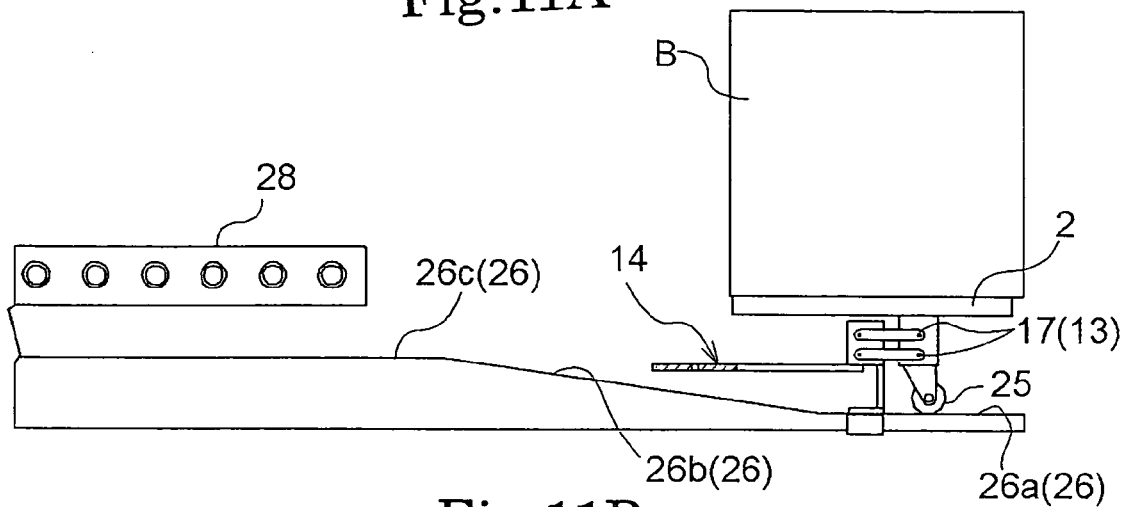
FIGS. 11A, 11B and 11C are side views showing the operation of the article placing member.
Figure 11B:
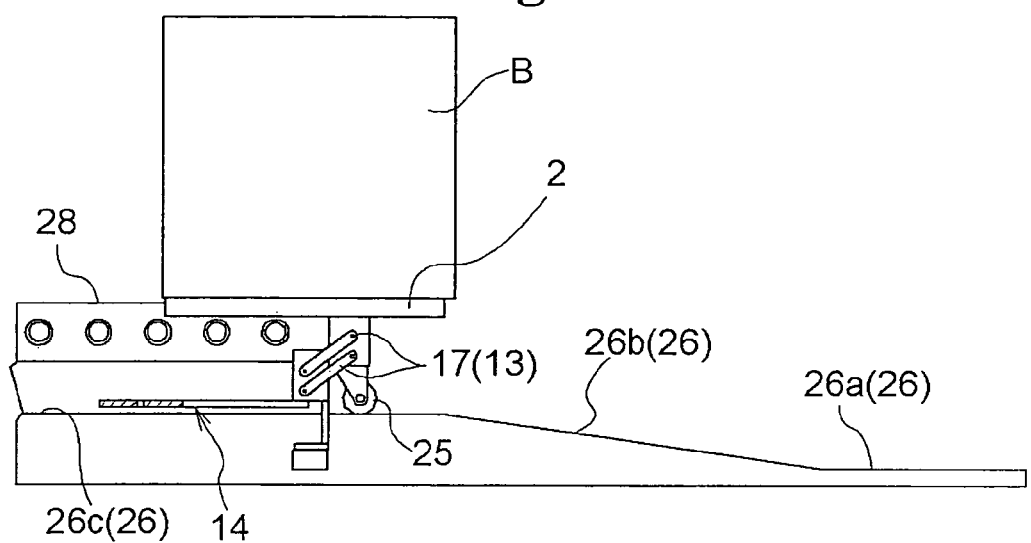
Figure 11C:
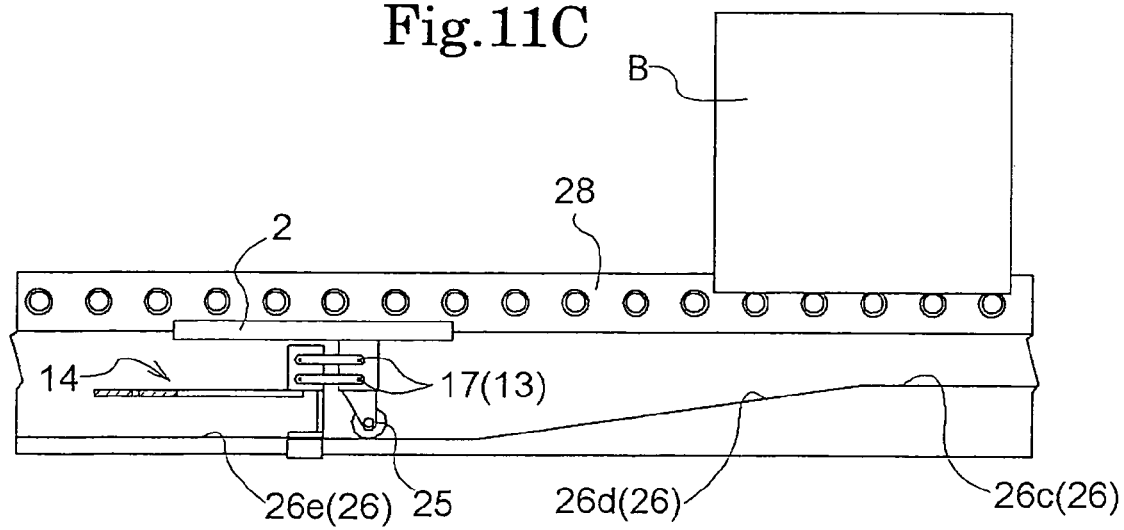

As shown in FIGS. 11A, 11B and 11C, the elevation rail 26 is constituted by a flat front end portion 26a, an upward portion 26b that is inclined upward as being closer to the rear end side, a flat middle portion 26c, a downward portion 26d that is inclined downward as being closer to the rear end side, and a flat rear end portion 26e, in this order from the front end side in a side view.

The elevation rail 26 is configured so as to guide the elevation guide roller 25 in the vertical direction by abutting against the elevation guide roller 25 from below.

When the front end portion 26a guides the elevation guide roller 25, an article B that is supported on the article placing member 2 for transfer is positioned below the receiving roller conveyer 28 as shown in FIG. 11A. When the upward portion 26b guides the elevation guide roller 25, as shown in FIG. 11B, the article placing member 2 for transfer is gradually raised and finally positioned above the receiving roller conveyer 28, and the article placing member 2 for transfer is moved closer to the receiving roller conveyer 28 in a state where the article B that is supported on the article placing member 2 for transfer is positioned above the receiving roller conveyer 28. When the middle portion 26c guides the elevation guide roller 25, the state is kept in which the article placing member 2 for transfer is positioned above the receiving roller conveyer 28. When the downward portion 26d guides the elevation guide roller 25, as shown in FIG. 11C, the article placing member 2 for transfer is gradually lowered from the position above the receiving roller conveyer 28 and finally the article placing member 2 for transfer is positioned below the receiving roller conveyer 28.

In this manner, when the elevation rail 26 guides the elevation guide roller 25, at the article delivering location 3, in a state where an article B supported on the article placing member 2 for transfer that is positioned at the away position is above the receiving roller conveyer 28, the article B is moved closer to the receiving roller conveyer 28. Then, the article placing member 2 for transfer is gradually lowered and finally positioned below the receiving roller conveyer 28, and the article B supported on the article placing member 2 for transfer is delivered to the receiving roller conveyer 28.

When an article is delivered from the article placing member 2 for transfer to the receiving roller conveyer 28 at the article delivering location 3, first, the article placing member 2 for transfer is positioned at the away positions along the guide rail 24, and the article placing member 2 for transfer is positioned so as to be overlapped with the receiving roller conveyer 28 in the vertical direction. When the article placing member 2 for transfer is positioned so as to be overlapped with the receiving roller conveyer 28 in the vertical direction in this manner, it is possible to deliver the article B from the article placing member 2 for transfer to the receiving roller conveyer 28 simply by guiding with the elevation rail 26 to vertically move the article placing member 2 for transfer.

At that time, the movement distance over which the article placing member 2 for transfer moves is only a distance over which the article placing member 2 for transfer is vertically moved in order to deliver the article B from the article placing member 2 for transfer to the receiving roller conveyer 28. Thus, the configuration for delivering articles at the article delivering location 3 can be made smaller and simpler.

Figure 12A:
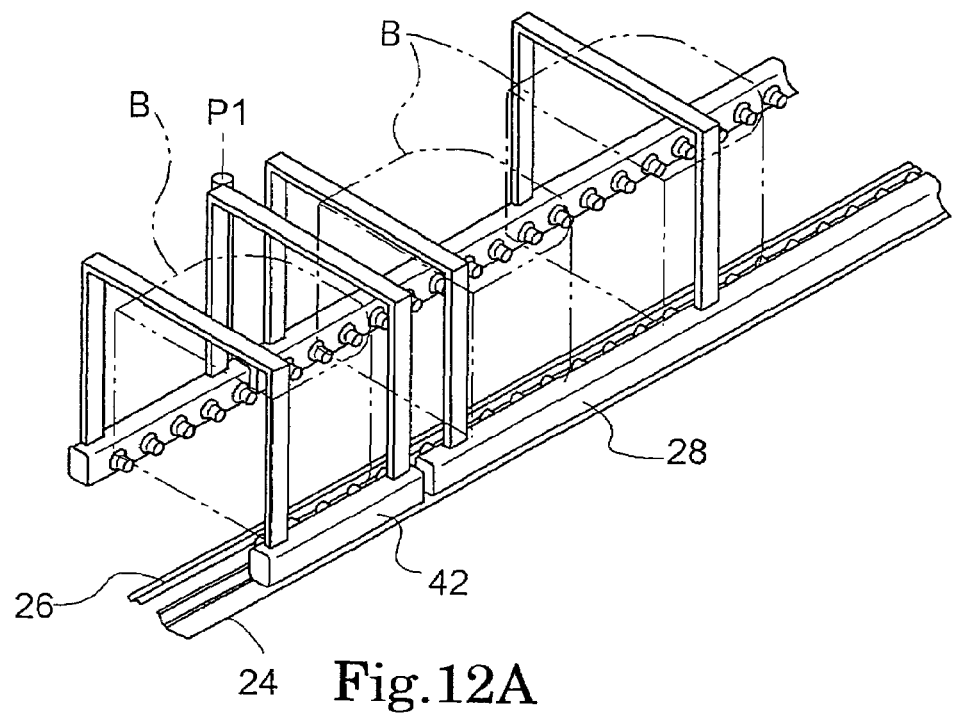
FIGS. 12A and 12B are perspective views showing transportation of articles from an article delivering location to an article take-out location.
Figure 12B:
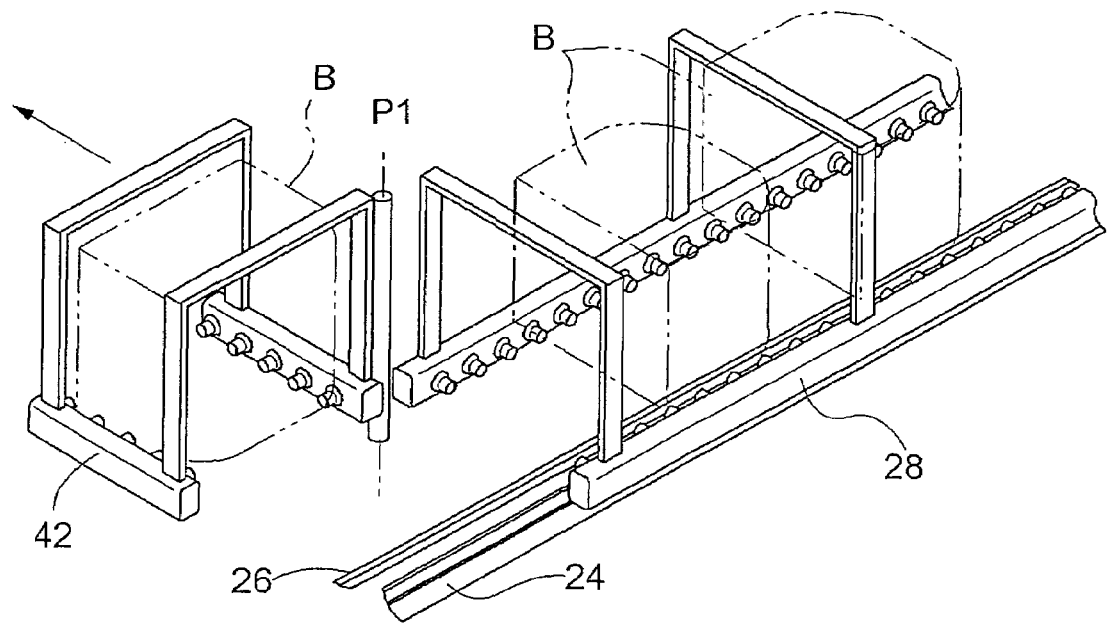

Furthermore, even in a simple configuration in which the elevation rail 26 guides the elevation guide roller 25, it is possible to deliver the article B from the article placing member 2 for transfer to the receiving roller conveyer 28 simply by installing the receiving roller conveyer 28 at the article delivering location 3. Thus, the configuration for delivering articles at the article delivering location 3 can be made further simpler. As shown in FIGS. 12A and 12B, the article-placing transport means 22 that is constituted by the receiving roller conveyer 28 and the take-out roller conveyer 42 transports an article B that has been delivered from the article placing member 2, in the horizontal direction or a substantially horizontal direction from the article delivering location 3 to the article take-out location 27. Herein, a plurality of articles B can be placed between the article delivering location 3 and the article take-out location 27.

The receiving roller conveyer 28 transports articles B that have been delivered from the article placing members 2 in parallel or substantially parallel with the revolving direction of the endless revolving body 1. The take-out roller conveyer 42 can change the transport direction of an article B that has been transported by the receiving roller conveyer 28 by 90 degrees.

The take-out roller conveyer 42 can turn about a first vertical axis P1. When the take-out roller conveyer 42 turns, the transport direction of an article B that has been transported from the receiving roller conveyer 28 is changed by 90 degrees, and the article B is transported to the article take-out location 27.

On the receiving roller conveyer 28, two articles B can be placed on the downstream side, in the transport direction, of a location at which articles B are received from the article placing members 2. On the take-out roller conveyer 42, one article B can be placed. In this manner, at the article delivering location 3, up to three articles B that have been delivered from the article placing members 2 can be placed between the article delivering location 3 and the article take-out location 27.

The receiving roller conveyer 28 and the take-out roller conveyer 42 transport articles B that have been delivered from the article placing members 2 at the article delivering location 3, to the article take-out location 27 by moving the articles B one after another toward the article take-out location 27 in a state where the articles B are placed between the article delivering location 3 and the article take-out location 27.

Figure 13A:
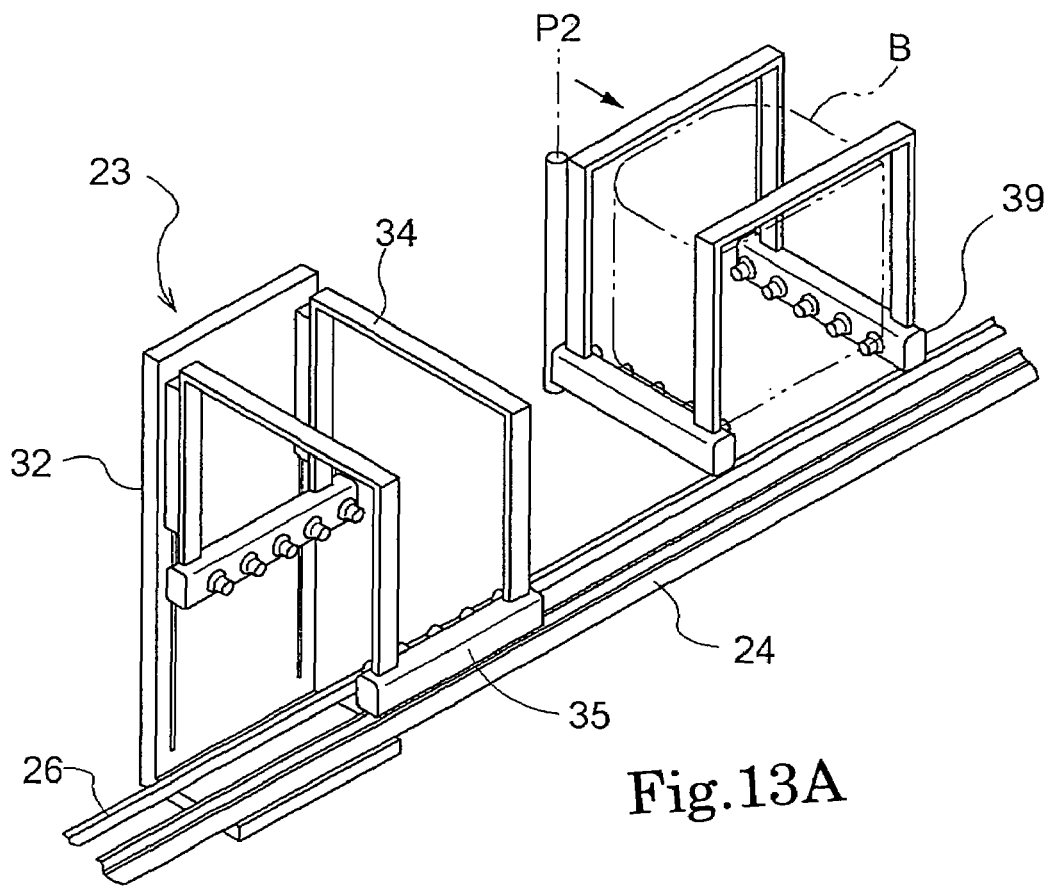
FIGS. 13A and 13B are perspective views showing transportation of an article from an article take-in location to an article receiving location.
Figure 13B:
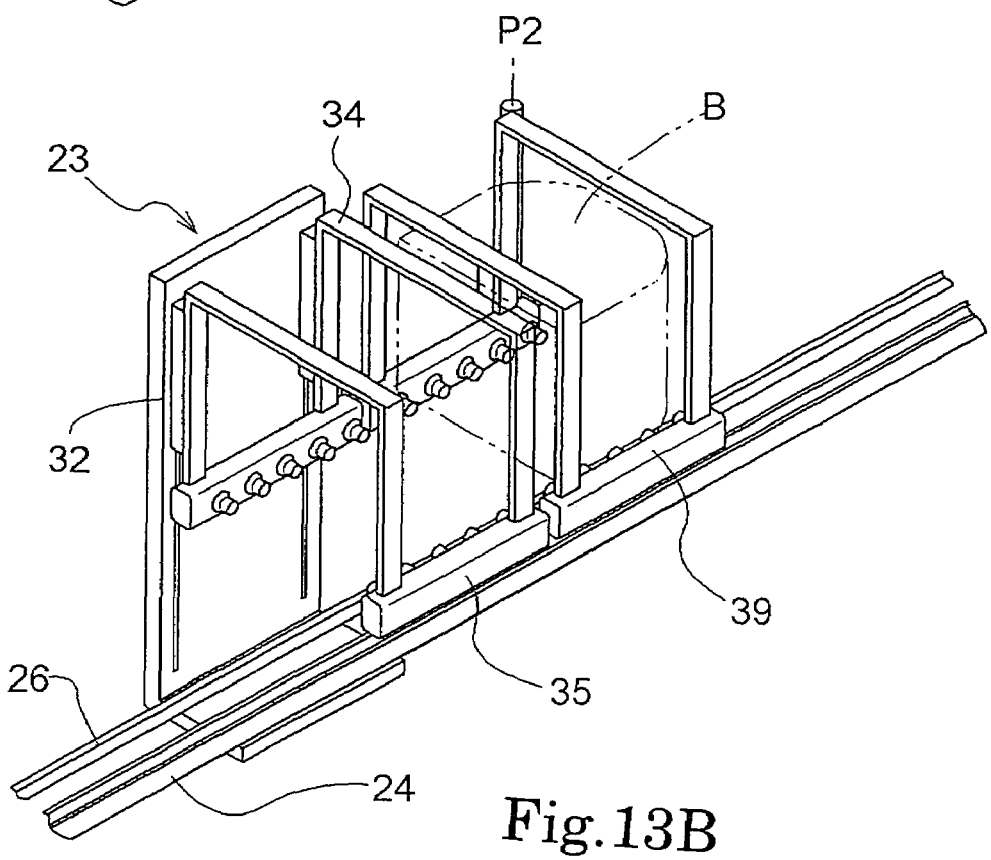

As shown in FIGS. 13A and 13B, the take-in roller conveyer 39 can turn about a second vertical axis P2. When the take-in roller conveyer 39 turns, an article B that has been taken in at the article take-in location 38 can be transported to the delivering roller conveyer 35 of the article delivering means 23.

When an article B is transported from the take-in roller conveyer 39, the article delivering means 23 delivers the article B that is placed and supported on the article-receiving placing portion to the article placing member 2 that is positioned at the away position at the article receiving location 4.

The article delivering means 23 vertically moves the delivering roller conveyer 35 such that an article B that is supported by the delivering roller conveyer 35 is delivered to the article placing member 2, by moving the delivering roller conveyer 35 in synchronization with the movement of the article placing member 2 that is positioned at the away position at the article receiving location 4, and lowering the article B from a position above the article placing member 2 that is positioned at the away position at the article receiving location 4.

Figure 14:
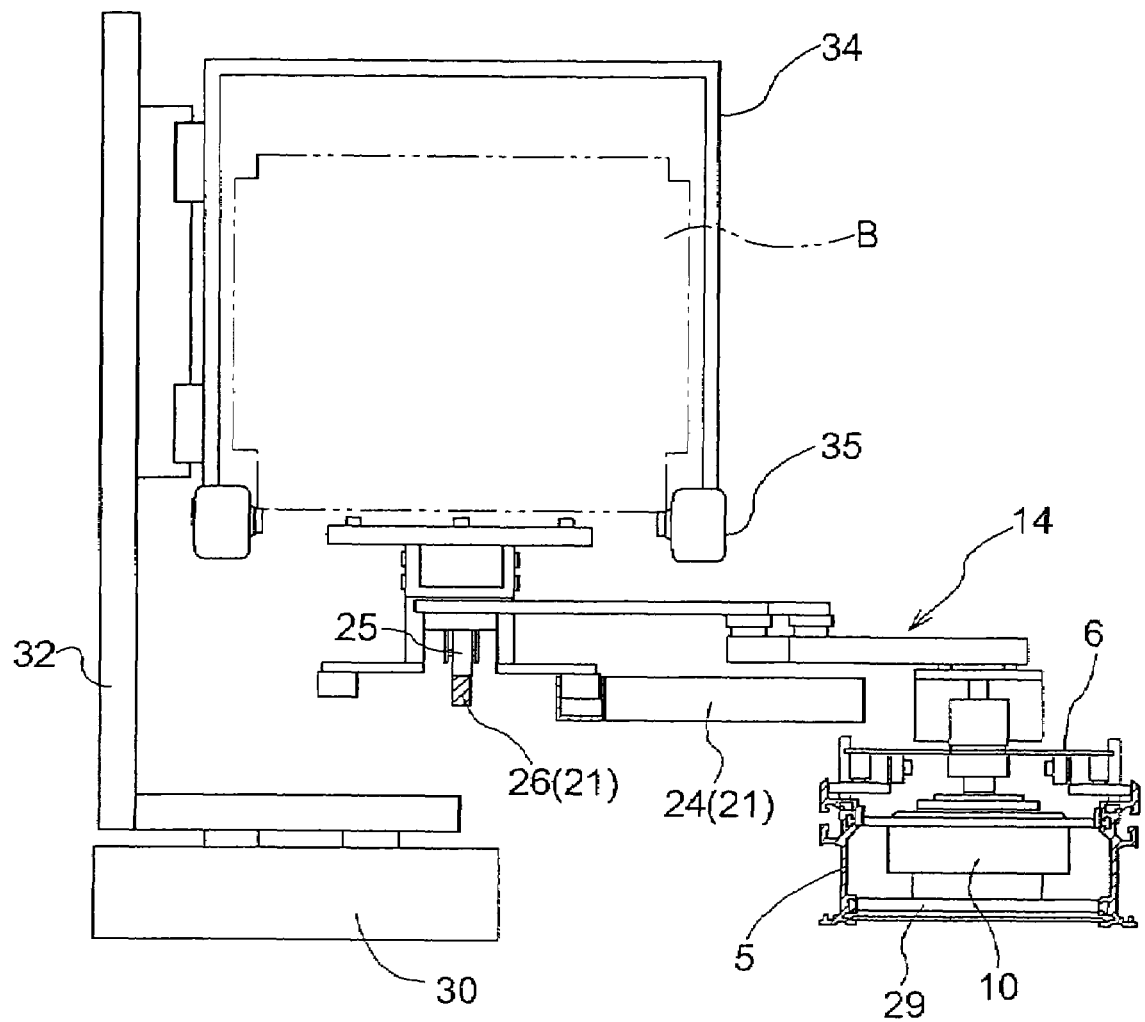
FIG. 14 is a cross-sectional view of article delivering means.

As shown in FIG. 14, the article delivering means 23 is constituted by an elevation frame 34 that supports the delivering roller conveyer 35 in a fixed manner, and a reciprocation frame 32 that cantilevers the elevation frame 34 in a vertically movable manner in the vertical direction and that can reciprocate in the longitudinal direction of a guide member 30 in the revolving direction of the endless revolving body 1, for example. As shown in FIG. 3, the guide member 30 is installed over the entire length of the article receiving location 4.

Although not shown, a reciprocation motor for reciprocating the reciprocation frame 32 in the longitudinal direction of the guide member 30, and an elevation motor for elevating the elevation frame 34, for example, are also provided.

The following is a description concerning the operation of the article delivering means 23. When an article B is transported from the take-in roller conveyer 39 to the delivering roller conveyer 35, the operation of the delivering roller conveyer 35 is stopped, and in a state where the article B is placed and supported on the delivering roller conveyer 35, the elevation frame 34 is raised with respect to the reciprocation frame 32 such that the article B that is supported by the delivering roller conveyer 35 is positioned above the article placing member 2, and thus the delivering roller conveyer 35 is put on standby at a start position for moving the delivering roller conveyer 35 in synchronization with the movement of the article placing member 2 that is positioned at the away position in a state where the delivering roller conveyer 35 is overlapped with a loci of the article placing member 2 in the vertical direction.

When the article placing member 2 for transfer reaches a position corresponding to the movement start position, as shown in FIGS. 15A and 15B, the reciprocation frame 32 is moved in synchronization with the movement of the article placing member 2, and the elevation frame 34 is lowered such that the delivering roller conveyer 35 is gradually lowered from the position above the article placing member 2 and finally positioned below the article placing member 2.

In a state where the delivering roller conveyer 35 is moved in synchronization with the movement of the article placing member 2 in this manner, it is possible for the article delivering means 23 to load an article B from the delivering roller conveyer 35 onto the article placing member 2 for transfer, simply by lowering the delivering roller conveyer 35.

At that time, the movement distance over which the delivering roller conveyer 35 is moved in synchronization with the movement of the article placing member 2 for transfer is only a distance over which the delivering roller conveyer 35 is lowered in order to load the article B from the delivering roller conveyer 35 onto the article placing member 2 for transfer. Thus, the configuration of the article delivering means 23 can be made smaller and simpler.

The following is a description concerning the operation of the article transport device.

The operation of the article transport device is controlled by control means (out of the drawing). Herein, the control means manages various types of information such as the current positions of the article placing members 2 on the endless revolving body 1, and combinations between the article placing members 2 and articles B placed and supported thereon. The operation of the article transport device is controlled based on the managed information.

First, a case is described in which an article B is delivered from the article placing member 2 to the receiving roller conveyer 28 at the article delivering location 3.

Figure 9B:
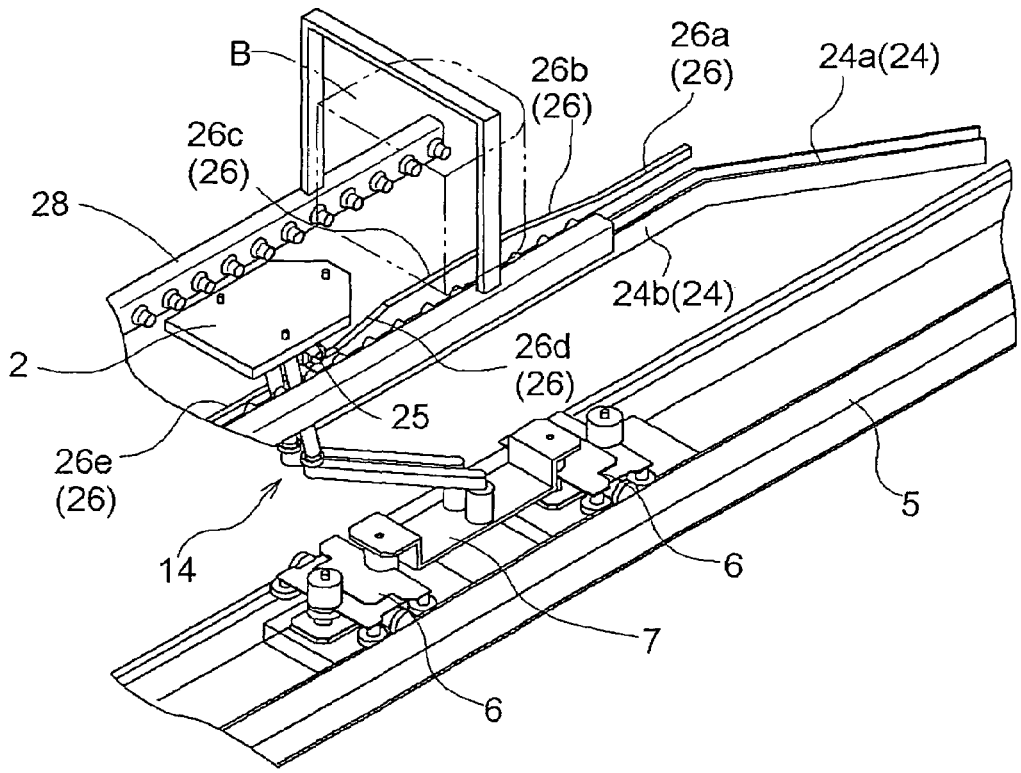

In a state where the endless revolving body 1 is revolved in a circular manner, when the article placing member 2 for transfer reaches a prescribed fork-position before the fork-switching means 40, the state is switched from the non-fork state to the fork state with the fork-switching means 40. As shown in FIGS. 8 and 9, when the second horizontal guide roller 20b is guided by the fork guide rail 40a and the first horizontal guide roller 20a is guided by the guide rail 24, the article placing member 2 for transfer that is positioned at the transport position is moved from the transport position to the away position at a location before the article delivering location 3. Then, as shown in FIGS. 11A, 11B and 11C, when the elevation guide roller 25 is guided by the elevation rail 26, the article placing member 2 for transfer is moved closer to the receiving roller conveyer 28 in a state where in the horizontal direction, the article placing member 2 is positioned at an away position vertically overlapped with the receiving roller conveyer 28, and in the vertical direction, the supported article B is positioned above the receiving roller conveyer 28.

When the elevation guide roller 25 is guided by the elevation rail 26, the article placing member 2 for transfer is lowered to a position below the receiving roller conveyer 28, and delivers the supported article B to the receiving roller conveyer 28.

Then, when the article placing member 2 for transfer passes the article receiving location 4 and then reaches a prescribed merging-position before the merging-switching means 41, the state is switched from the withdrawn state to the merging state with the merging-switching means 41. As shown in FIGS. 10A and 10B, when the first horizontal guide roller 20a is guided by the guide rail 24 and the second horizontal guide roller 20b is guided by the merging guide rail 41a, the article placing member 2 for transfer that is positioned at the away position is moved from the away position to the transport position.

In this manner, at the article delivering location 3, an article B is delivered from the article placing member 2 for transfer to the receiving roller conveyer 28. Herein, it is possible to successively deliver articles B from the article placing members 2 for transfer to the receiving roller conveyer 28 at the article delivering location 3.

More specifically, the receiving roller conveyer 28 and the take-out roller conveyer 42 transport articles B that have been delivered from the article placing members 2 for transfer at the article delivering location 3, one after another to the article take-out location 27 in a state where the articles B are placed between the article delivering location 3 and the article take-out location 27. Accordingly, even when articles B are delivered from the article placing members 2 for transfer, the articles B are transported one after another to the article take-out location 27, and thus on the receiving roller conveyer 28, it is possible to secure a space on which an article B is received from the next article placing member 2 for transfer.

The plurality of article placing members 2 for transfer are successively moved from the transport position to the away position along the guide rail 24, and thus articles B are successively delivered from the article placing members 2 for transfer to the receiving roller conveyer 28 at the article delivering location 3.

The receiving roller conveyer 28 transports articles B that have been delivered from the article placing members 2 at the article delivering location 3, to the take-out roller conveyer 42 by moving the articles B one after another toward the article take-out location 27 every time the articles B are taken out at the article take-out location 27. The take-out roller conveyer 42 turns to transport the articles B that have been transported from the receiving roller conveyer 28 to the article take-out location 27.

Next, a case is described in which an article B is loaded from the delivering roller conveyer 35 onto the article placing member 2 at the article receiving location 4.

In this case, first, as shown in FIGS. 13A and 13B, with the take-in roller conveyer 39 and the delivering roller conveyer 35 of the article delivering means 23, an article B that has been taken in at the article take-in location 38 is placed and supported on the delivering roller conveyer 35. Then, the article delivering means 23 puts the delivering roller conveyer 35 on standby such that the article B that is supported by the delivering roller conveyer 35 is positioned above the article placing member 2 for transfer that is positioned at the away position in a state where the article B is overlapped with a loci of the article placing member 2 for transfer in the vertical direction.

As in the case where an article B is delivered from the article placing member 2 to the receiving roller conveyor 28 at the article delivering location 3, in a state where the endless revolving body 1 is revolved in a circular manner, when the article placing member 2 for transfer reaches a prescribed fork-position before the fork-switching means 40, the state is switched from the non-fork state to the fork state with the fork-switching means 40. At a location before the article delivering location 3, the article placing member 2 that is positioned at the transport position is moved from the transport position to the away position.

Then, when the article placing member 2 for transfer that is positioned at the away position passes the article delivering location 3 and then reaches a position corresponding to the movement start position of the delivering roller conveyor 35 while the article placing member 2 is kept at the away positions, as shown in FIGS. 15A and 15B, the article delivering means 23 loads an article B that is supported by the delivering roller conveyor 35 onto the article placing member 2, by moving the delivering roller conveyor 35 in synchronization with the movement of the article placing member 2 and lowering the delivering roller conveyor 35 from a position above the article placing member 2 to a position therebelow.

Furthermore, when the article placing member 2 for transfer on which the article B is loaded passes the article receiving location 4 and then reaches the prescribed merging-position before the merging-switching means 41, the state is switched from the withdrawn state to the merging state with the merging-switching means 41, and the article placing member 2 that is positioned at the away position is moved from the away position to the transport position.

Next, a case is described in which an article B is not delivered at the article delivering location 3 and an article B is not received at the article receiving location 4.

In this case, in a state where the endless revolving body 1 is revolved in a circular manner, even when the article placing member 2 other than the article placing member 2 for transfer reaches the prescribed fork-position before the fork-switching means 40, the state is kept at the non-fork state with the fork-switching means 40. Accordingly, the second horizontal guide roller 20b is not guided by the fork guide rail 40a, and the first horizontal guide roller 20a is not guided by the guide rail 24, and the article placing member 2 is led through the article delivering location 3 and the article receiving location 4 in a state where the article placing member 2 is positioned at the transport positions.

Second Embodiment

Next, a second embodiment is described.

The second embodiment is another embodiment concerning the configuration in which the article placing member 2 that is positioned at the transport position is moved to the fork-middle position and the configuration in which the article placing member 2 that is positioned at the merging-middle position is moved to the transport position in the first embodiment. These configurations are described in detail, and a detailed description of the other configurations has been omitted.

First, a configuration is described in which the article placing member 2 that is positioned at the transport position is moved to the fork-middle position.

Figure 16:
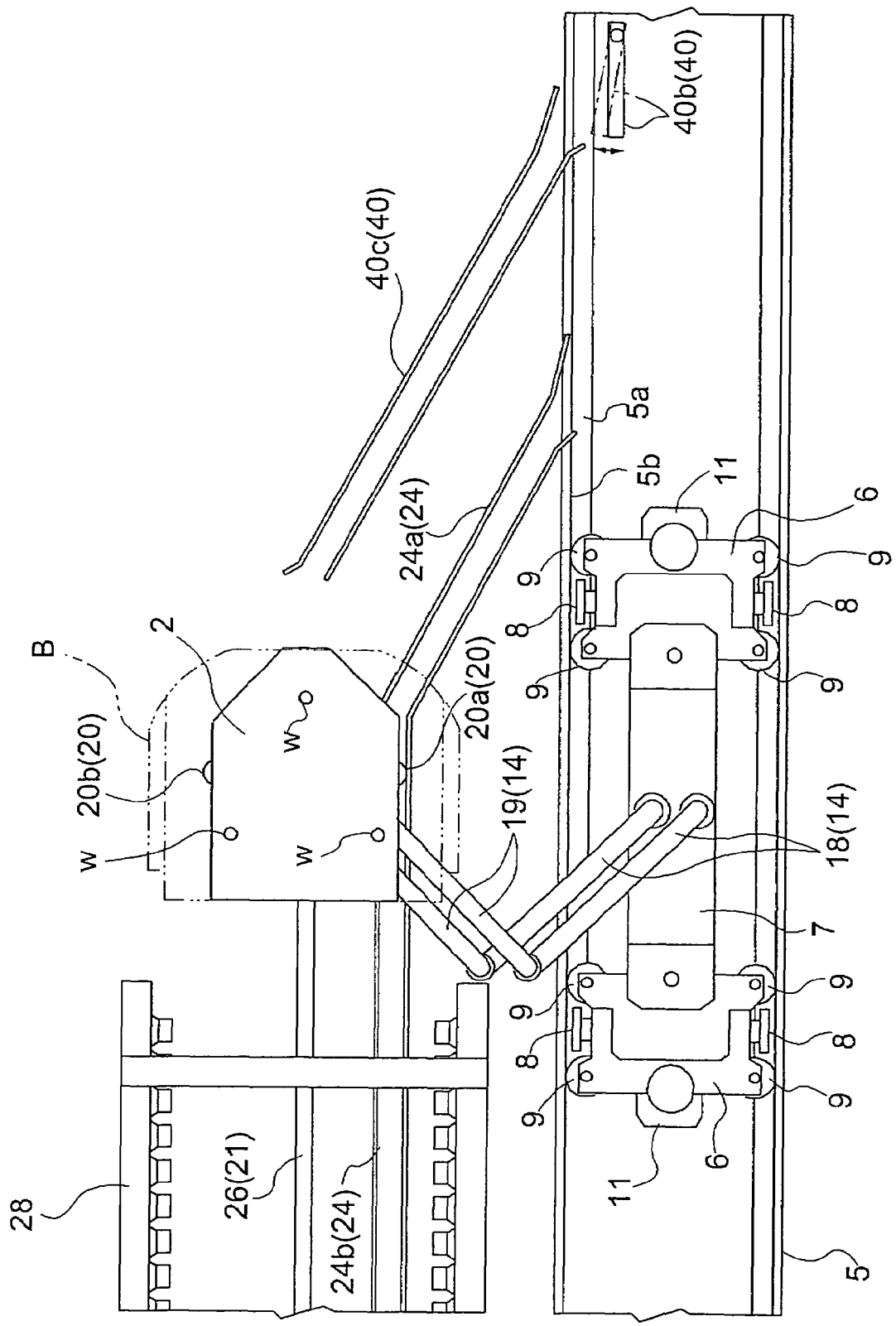
FIG. 16 is a plan view of the main portions of the article transport device in a second embodiment.

In the first embodiment, as shown in FIG. 2, is provided the fork-switching means 40 including the fork guide rail 40a that can horizontally move between the guide position at which the article placing member 2 that is positioned at the transport position is moved from the transport position to the fork-middle position, and the non-guide position. In the second embodiment, as shown in FIG. 16, is provided the fork-switching means 40 including a movable guide 40b that moves the article placing member 2 that is positioned at the transport position from the transport position toward the fork-middle position, and a fork-middle guide rail 40c that moves the article placing member 2 that has been moved by the movable guide 40b toward the fork-middle position to the fork-middle position.

The movable guide 40b is provided pivotably about a vertical axis between a guide position (broken line in FIG. 16) at which the article placing member 2 that is positioned at the transport position is moved from the transport position toward the fork-middle position, and a non-guide position (solid line in FIG. 16), and in the guide position, guides the second horizontal guide roller 20b toward the fork-middle position.

The fork-middle guide rail 40c is installed in a fixed manner at a position withdrawn to the outer side of a position at which the second horizontal guide roller 20b on the article placing member 2 that is positioned at the transport position passes, and thus the fork-middle guide rail 40c does not interfere with the article placing member 2 that is positioned at the transport position.

When the fork-switching means 40 switches the state to the fork state by positioning the movable guide 40b at the guide position, the second horizontal guide roller 20b is guided by the movable guide 40b toward the fork-middle position, and the article placing member 2 that is positioned at the transport position is moved toward the fork-middle position. Immediately after this guide by the movable guide 40b, the second horizontal guide roller 20b is guided by the fork-middle guide rail 40c, and the article placing member 2 is moved to the fork-middle position.

Furthermore, when the fork-switching means 40 switches the state to the non-fork state by positioning the movable guide 40b at the non-guide position, the second horizontal guide roller 20b is not guided by the movable guide 40b toward the fork-middle position, and the article placing member 2 that is positioned at the transport position is moved in a state where the article placing member 2 is kept at the transport positions.

The fork-switching means 40 is configured so as to usually keep the state at the non-fork state by positioning the movable guide 40b at the non-guide position, and to switch the state to the fork state by positioning the movable guide 40b at the guide position only when the article placing member 2 for transfer approaches.

Next, a configuration is described in which the article placing member 2 that is positioned at the merging-middle position is moved to the transport position.

Figure 17:
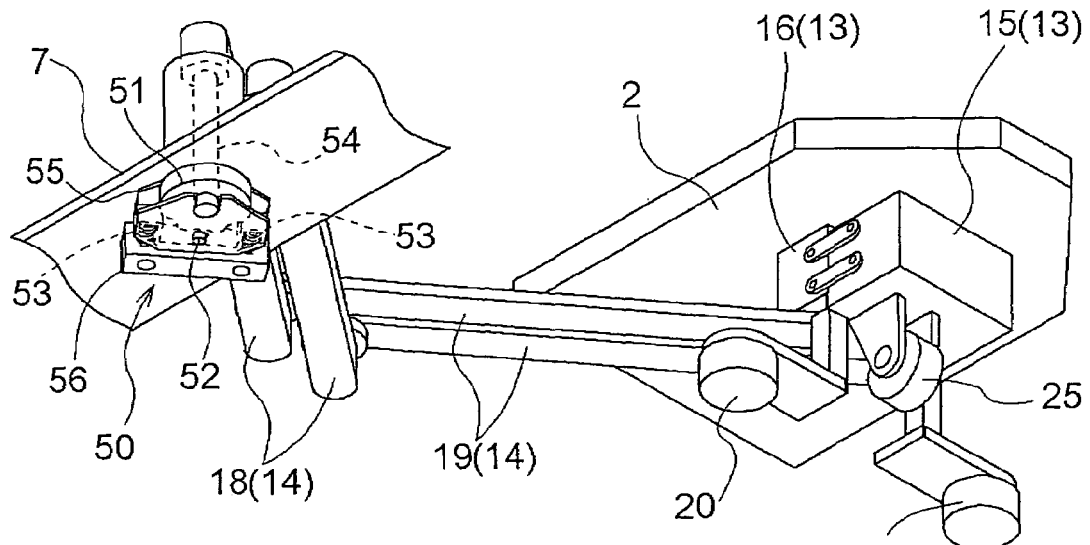
FIG. 17 is a perspective view of the main portions of the article transport device in the second embodiment.

In the first embodiment, as shown in FIG. 2, is provided the merging-switching means 41 including the merging guide rail 41a that can horizontally move between the guide position at which the article placing member 2 that is positioned at the merging-middle position is moved from the merging-middle position to the transport position, and the withdrawn position. In the second embodiment, as shown in FIG. 17, is provided position keeping means 50 for keeping the article placing member 2 at the transport position or the away position. With the position keeping action of the position keeping means 50, the article placing member 2 that is positioned at the merging-middle position is moved from the merging-middle position to the transport position without providing the merging-switching means 41.

Figure 18:
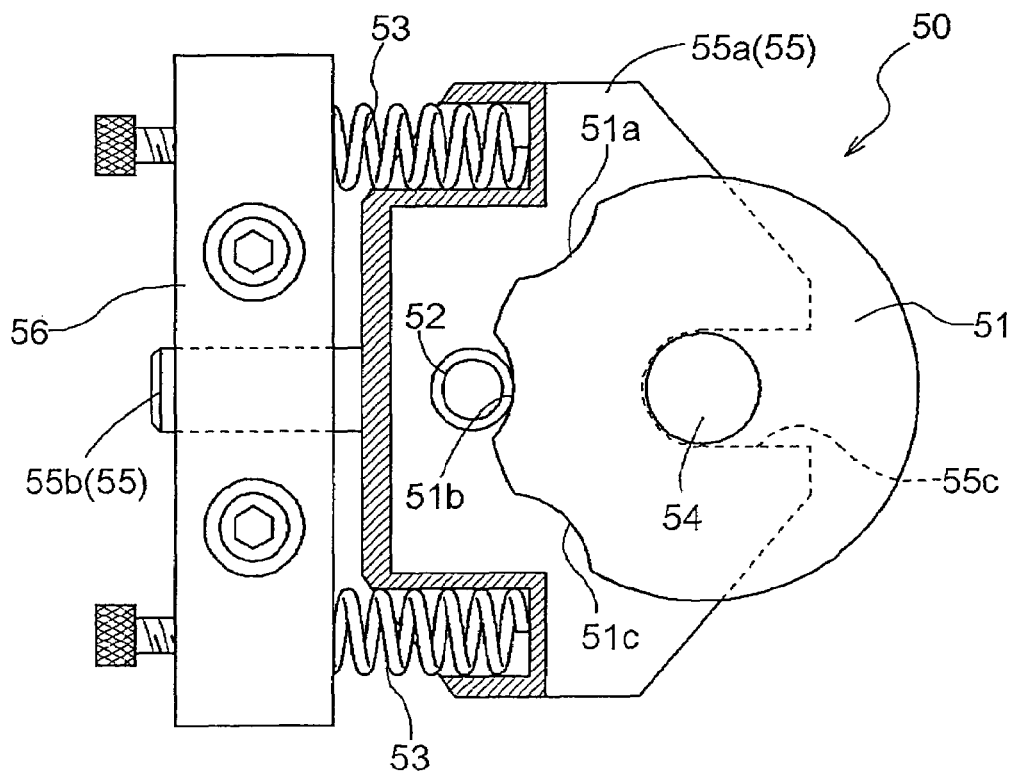
FIG. 18 is a plan view of position keeping means.

As shown in FIGS. 17 and 18, the position keeping means 50 is provided at the rear face portion of the coupling member 7, and includes a round cam member 51 that can revolve about a vertical axis together with the swinging of the first link arms 18, an engagement pin 52 that is engaged with an engagement groove 51a to 51c formed on the outer circumferential portion of the cam member 51, and a pair of elastic members (coil springs) 53 that resiliently bias the engagement pin 52 toward the engagement grooves 51a to 51c of the cam member 51.

FIG. 17 shows a perspective view of a state in which the article placing member 2 is positioned closer to the away position than to the transport position. FIG. 18 shows a plan view of the position keeping means 50.

The cam member 51 is provided corresponding to one of the pair of first link arms 18, and provided so as to revolve together with a vertical shaft portion 54 that is provided at a location coupling the first link arm 18 and the coupling member 7. More specifically, the cam member 51 is linked so as to revolve together with the swinging of the first link arms 18.

The engagement grooves 51a to 51c have shapes that are recessed inward on the cam member 51, and three engagement grooves 51a to 51c are provided apart from each other in the circumferential direction of the cam member 51. The second engagement groove 51b positioned at the center corresponds to the transport position, and the first engagement groove 51a and the third engagement groove 51c positioned on the sides correspond to the away positions.

The engagement pin 52 is supported by an engagement pin support 55 at a posture along the vertical direction. The engagement pin support 55 includes a pair of upper and lower plate portions 55a and a slide shaft portion 55b extending in the horizontal direction. The slide shaft portion 55b is provided in a slidable manner with respect to a hole portion that is formed on an elastic member bearing 56 bolted onto the rear face portion of the coupling member 7. The engagement pin support 55 is supported in a slidable manner with respect to the elastic member bearing 56. Furthermore, the engagement pin support 55 is disposed such that the cam member 51 is held between the pair of upper and lower plate portions 55a in a state where recessed groove portions 55c formed on the pair of upper and lower plate portions 55a are engaged with the shaft portion 54.

The elastic members 53 are provided between the elastic member bearing 56 and the engagement pin support 55, and bias the engagement pin support 55 to the side away from the elastic member bearing 56.

Figure 19A:
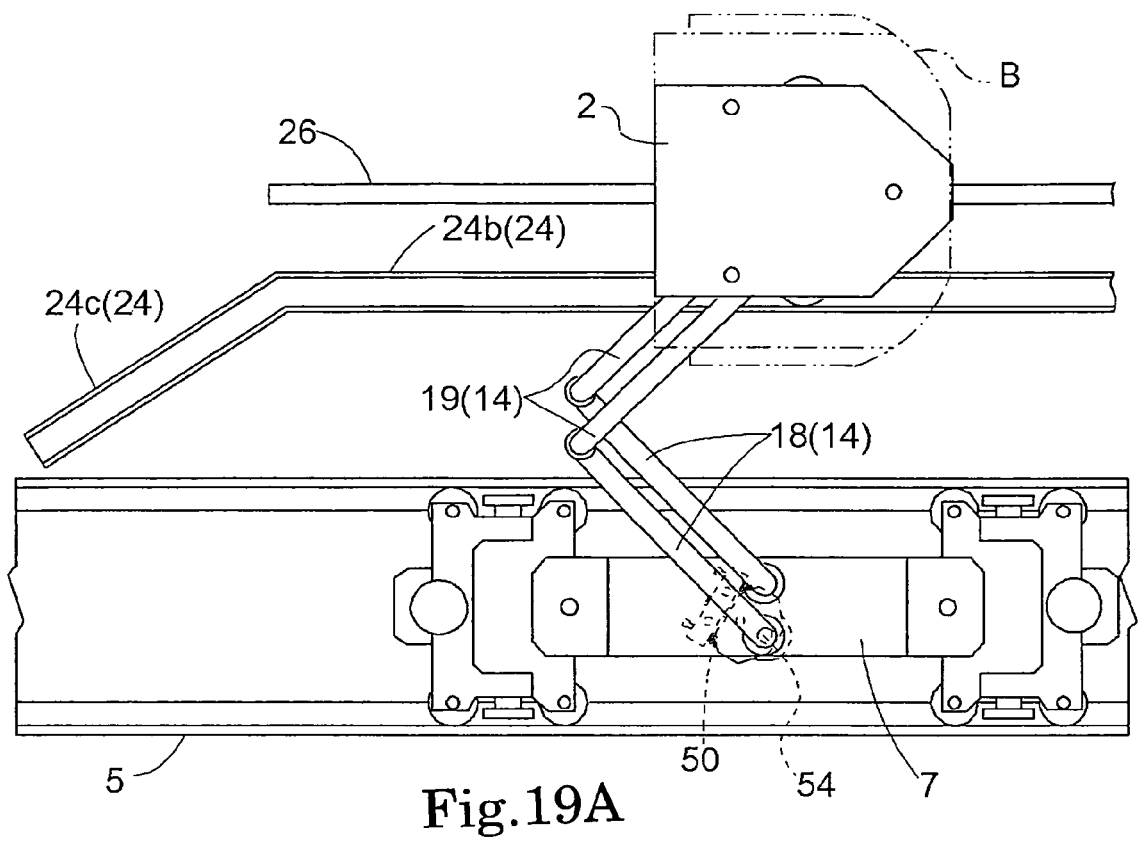
FIGS. 19A and 19B are views showing the operation of the article transport device in the second embodiment.
Figure 19B:
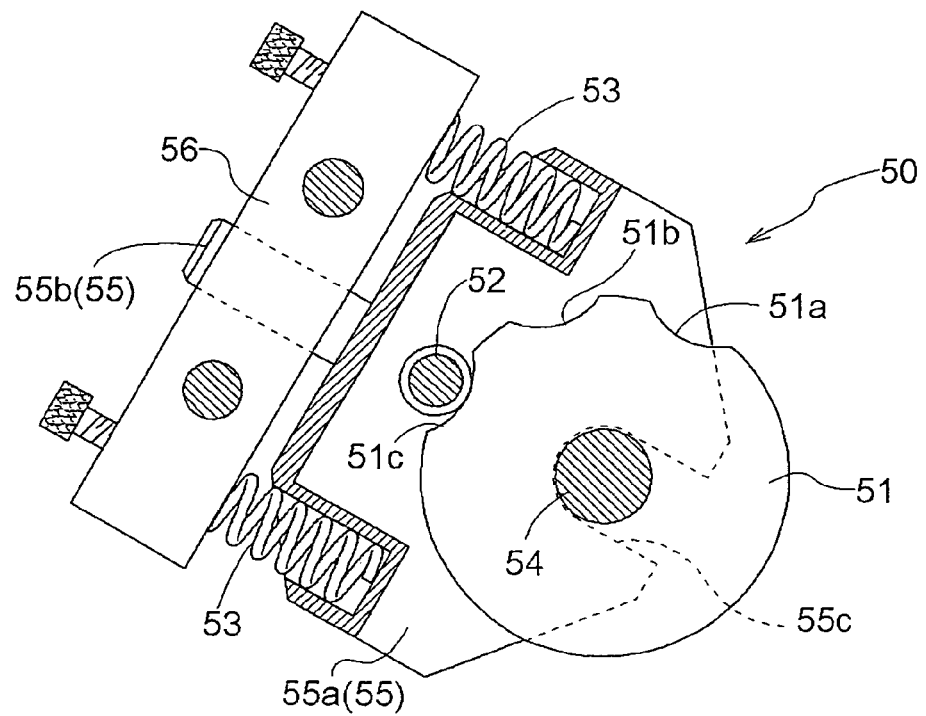
Figure 20A:
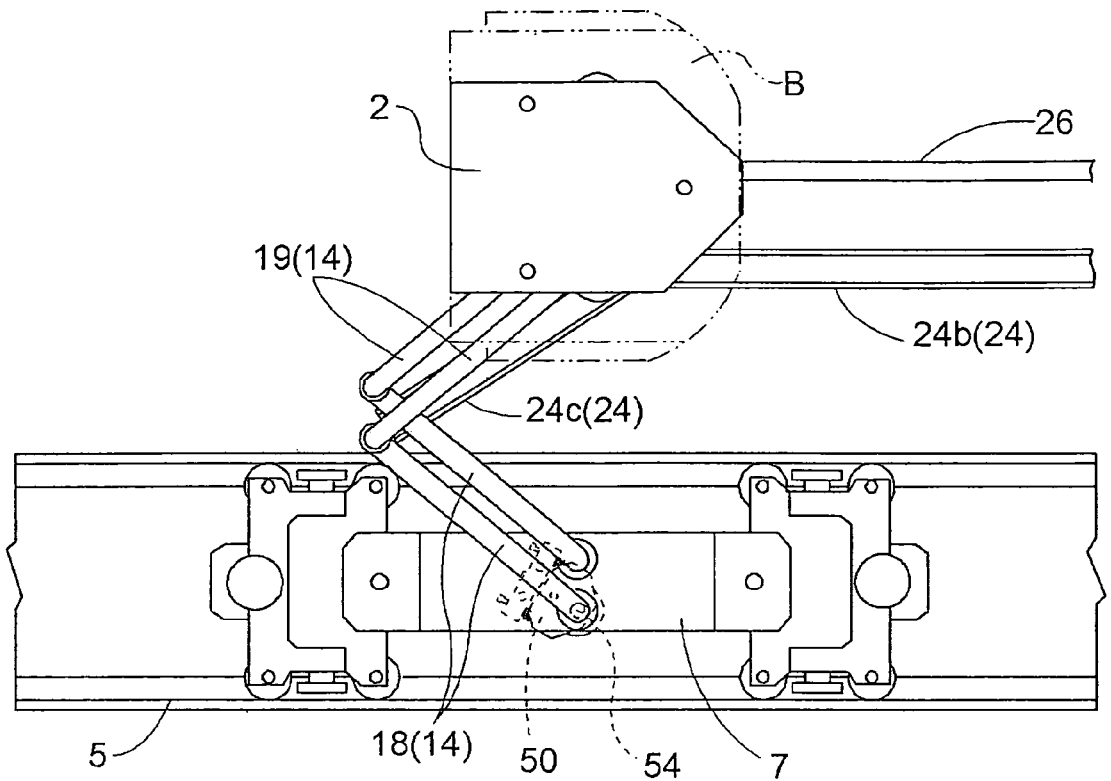
FIGS. 20A and 20B are views showing the operation of the article transport device in the second embodiment.
Figure 20B:
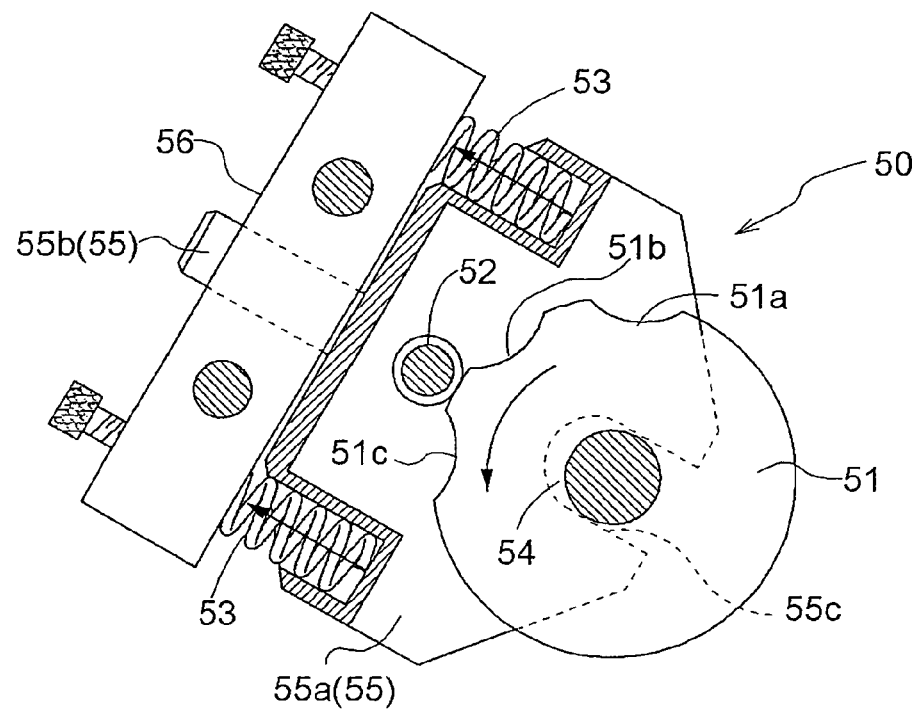
Figure 21A:
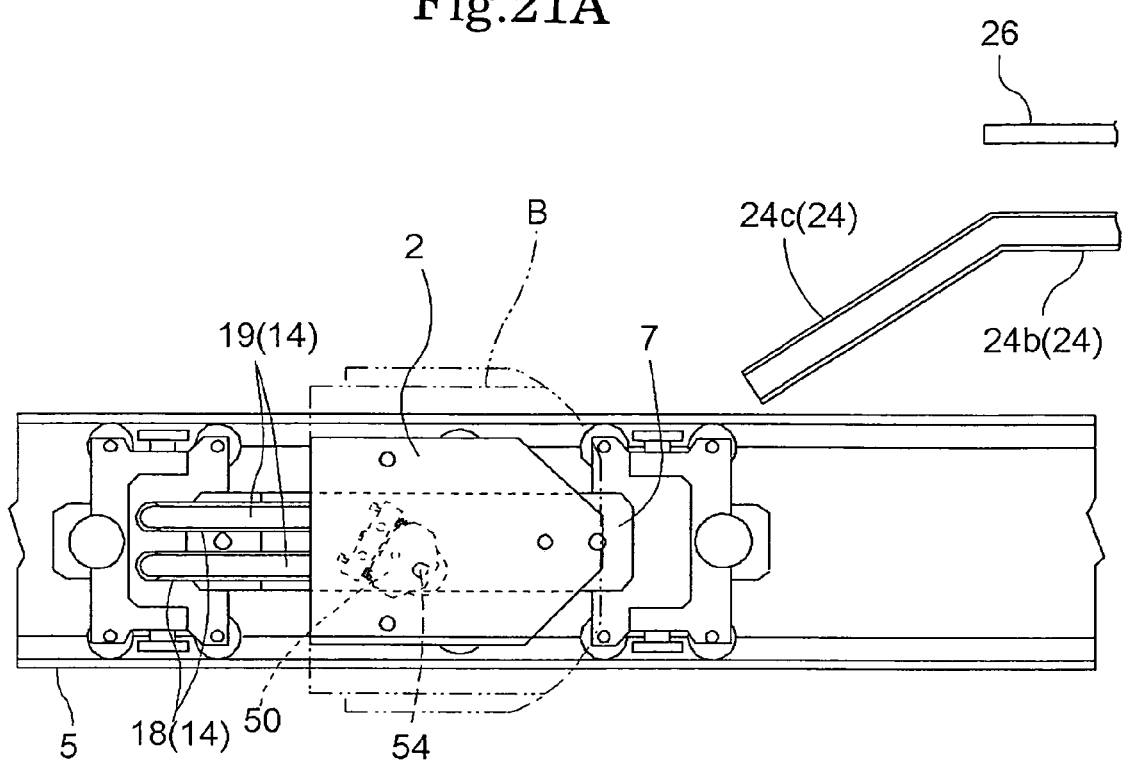
FIGS. 21A and 21B are views showing the operation of the article transport device in the second embodiment.
Figure 21B:
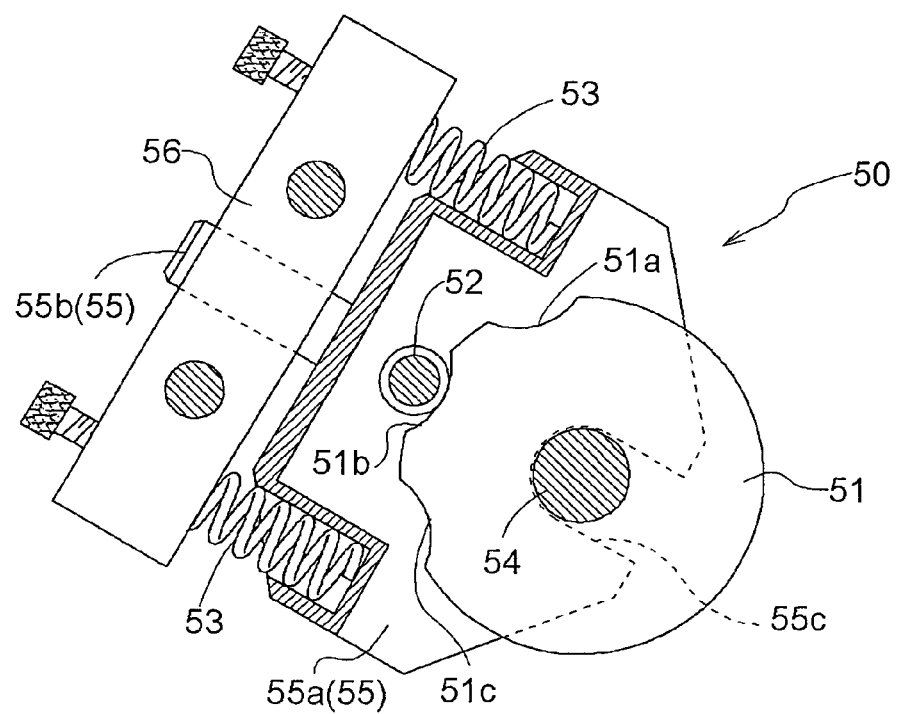

Based on FIGS. 19 to 21, the movement is described in which with the position keeping action of the position keeping means 50, the article placing member 2 that is positioned at the merging-middle position is moved from the merging-middle position to the transport position. FIGS. 19A, 20A and 21A show plan views of the movement of the article placing member 2, and FIGS. 19B, 20B and 21B show plan views of the operation of the position keeping means 50.

As shown in FIGS. 19A and 19B, when the article placing member 2 is positioned at the away position, the engagement pin 52 is engaged with the first engagement groove 51a or the third engagement groove 51c corresponding to the away position. FIGS. 19A and 19B show a case in which the engagement pin 52 is engaged with the third engagement groove 51c. When the engagement pin 52 is engaged with the third engagement groove 51c, the article placing member 2 is kept at the away positions, and horizontal vibrations of the article placing member 2 are prevented.

As shown in FIGS. 20A and 20B, the article placing member 2 is moved from the away position to the merging-middle position along the merging portion 24c of the guide rail 24. At that time, the first link arms 18 swing, and the cam member 51 revolves together with the swinging of the first link arms 18. Then, the engagement pin 52 is moved away from the third engagement groove 51c, and slides on the outer circumferential portion of the cam member 51.

Then, as shown in FIGS. 21A and 21B, due to the elastic force of the elastic members 53, the engagement pin 52 slides on the outer circumferential portion of the cam member 51 so as to be engaged with the second engagement groove 51b. When the engagement pin 52 slides, the cam member 51 revolves in the direction of the arrow in the drawing, the first link arms 18 swing together with the revolving of the cam member 51, and the article placing member 2 is moved to the transport position.

In this manner, with the position keeping action of the position keeping means 50, the article placing member 2 that is positioned at the merging-middle position is moved from the merging-middle position to the transport position.

Furthermore, when the article placing member 2 is positioned at the transport position, horizontal vibrations of the article placing member 2 are prevented by engaging the engagement pin 52 and the second engagement groove 51b, thereby keeping the article placing member 2 at the transport positions.

Other Embodiments (1) In the first and second embodiments, the away positions are fixed on the outer side of the endless revolving body 1, and the article delivering location 3 and the article receiving location 4 are used as a location for taking articles B out of the article transport devices to the article handling facility and a location for taking articles B from the article handling facility to the article transport devices. However, the application for which the article delivering location 3 and the article receiving location 4 are used may be changed as appropriate.

Figure 22:
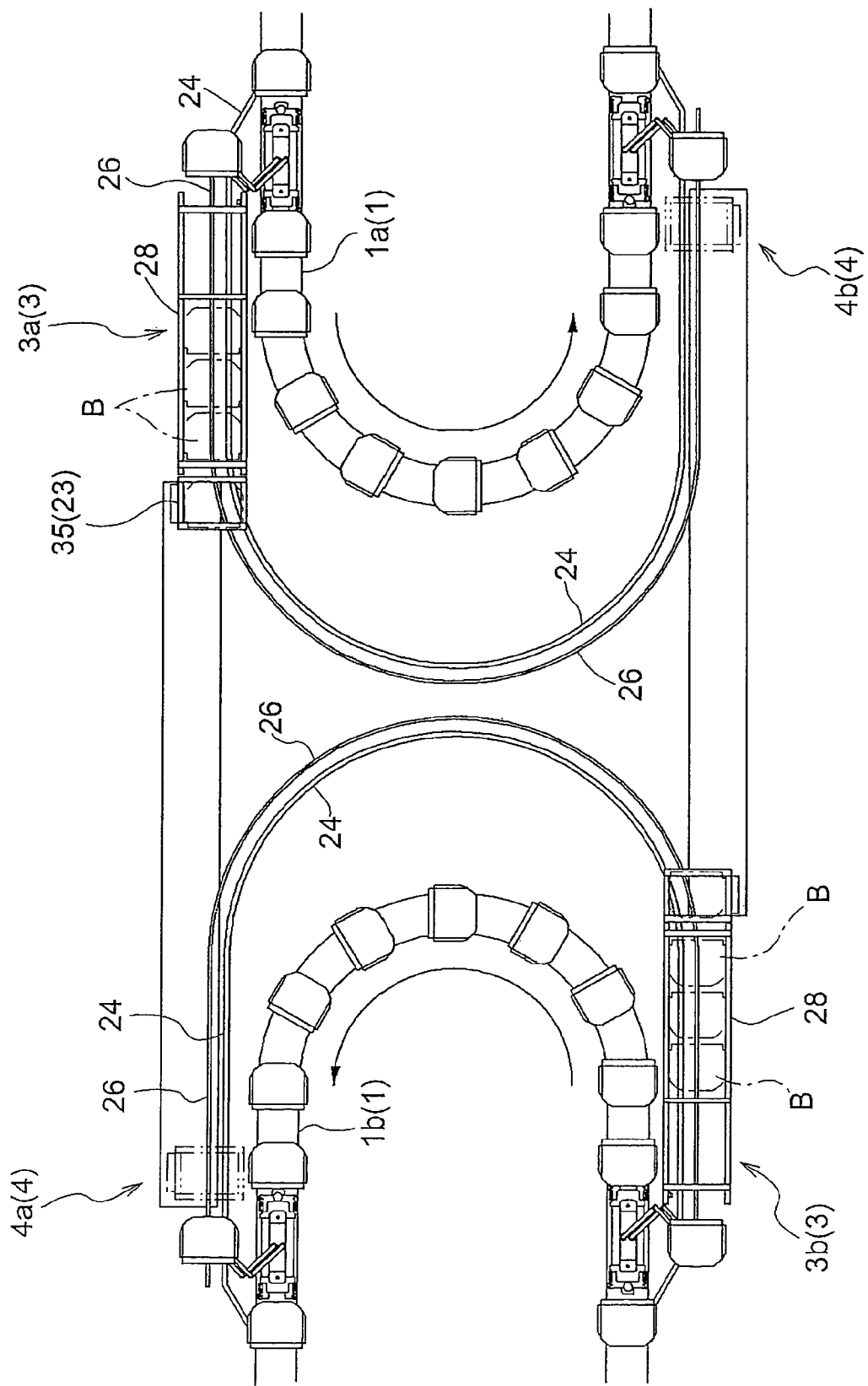
FIG. 22 is a plan view of the main portions of the article transport device in another embodiment.

For example, as shown in FIG. 22, the article delivering locations and the article receiving locations may be used as locations for delivering articles B and receiving articles B between the endless revolving bodies 1 that are adjacent to each other.

The article delivering location 3 and the article receiving location 4 that are arranged adjacent to each other are combined into one unit, and two such units connect the endless revolving bodies 1 that are adjacent to each other. One unit is used to deliver articles B from a first endless revolving body 1a to a second endless revolving body 1b, and the article delivering location 3 and the article receiving location 4 therein are referred to as a first article delivering location 3a and a first article receiving location 4a. Furthermore, the other unit is used to deliver articles B from the second endless revolving body 1b to the first endless revolving body 1a, and the article delivering location 3 and the article receiving location 4 therein are referred to as a second article delivering location 3b and a second article receiving location 4b.

As in the foregoing embodiments, the receiving roller conveyers 28 are provided corresponding to away positions at the first article delivering location 3a and the second article delivering location 3b. The guide rails 24 and the elevation rails 26, for example, are also provided. Furthermore, as in the foregoing embodiments, the first article receiving location 4a and the second article receiving location 4b are provided with the article delivering means 23 including the delivering roller conveyers 35.

Figure 23:
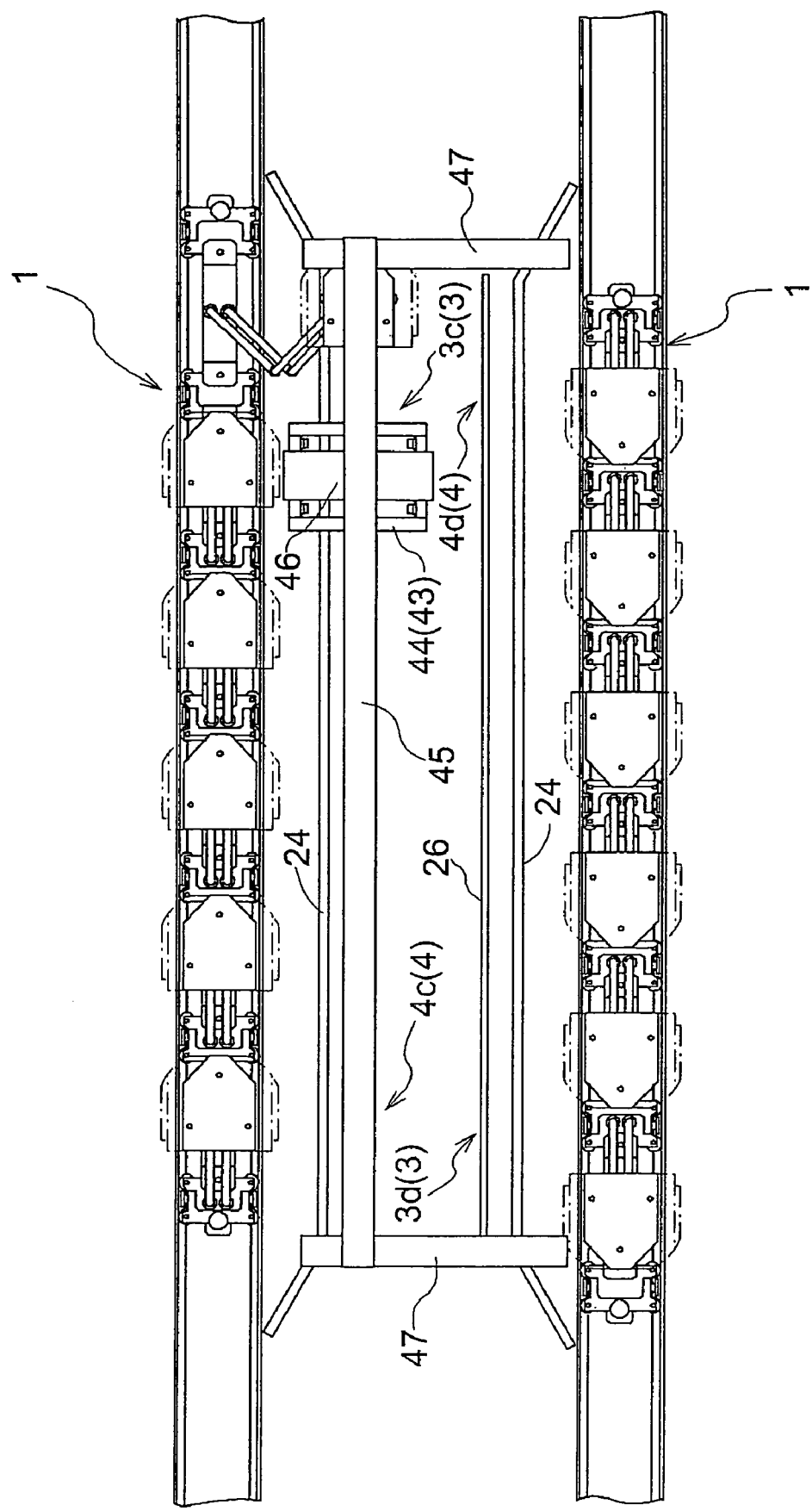
FIG. 23 is a plan view of the main portions of the article transport device in another embodiment.

Furthermore, as shown in FIGS. 23 to 25, the article delivering locations and the article receiving locations may be used as locations for delivering articles B and receiving articles B between the different article placing members 2 on the same the endless revolving body 1.

Figure 24A:
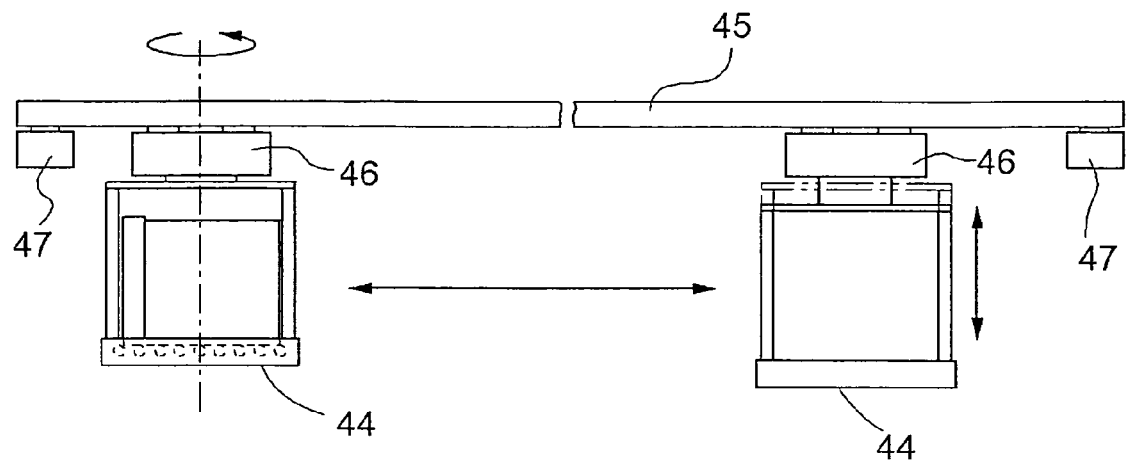
FIGS. 24A and 24B are a side view and a front view of the main portions of the article transport device in another embodiment.
Figure 24B:
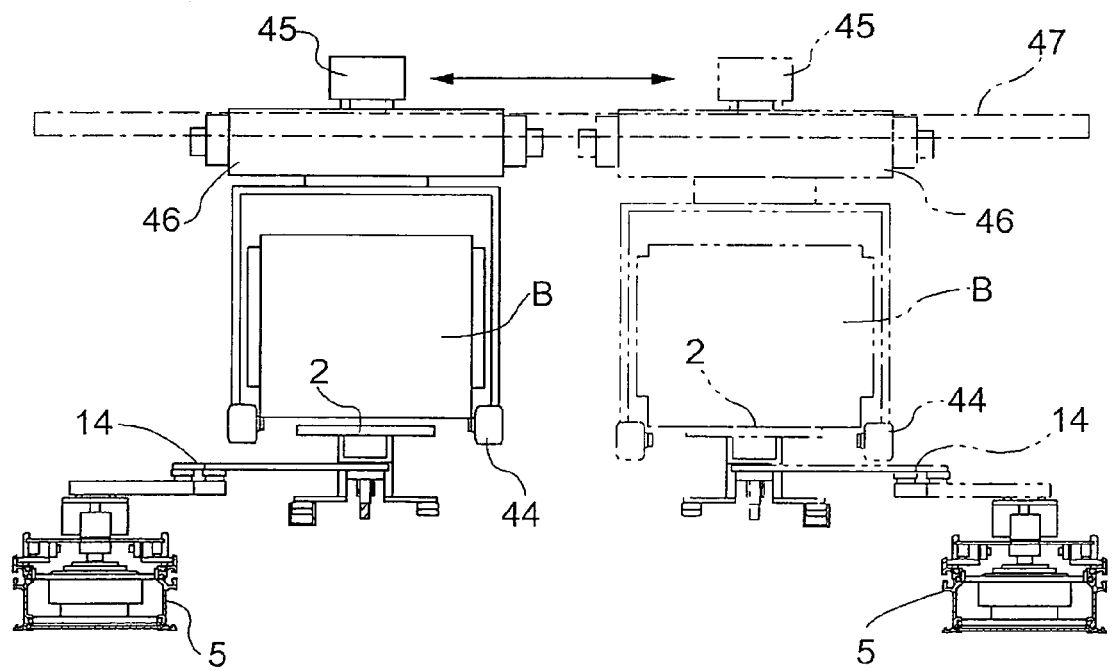
Figure 25A:
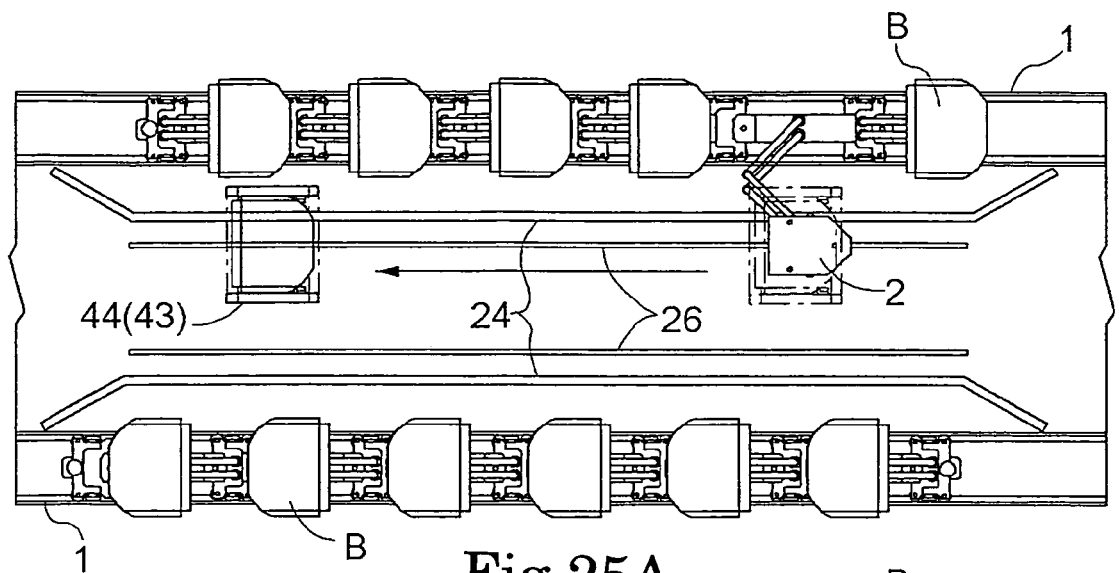
FIGS. 25A, 25B, and 25C are plan views showing the operation of the article transport device in another embodiment.
Figure 25B:
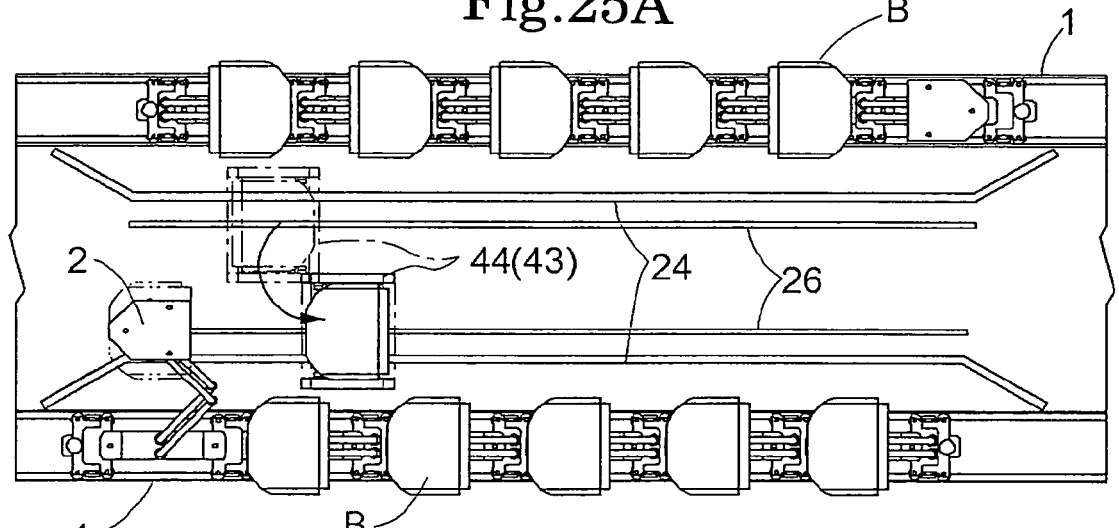
Figure 25C:
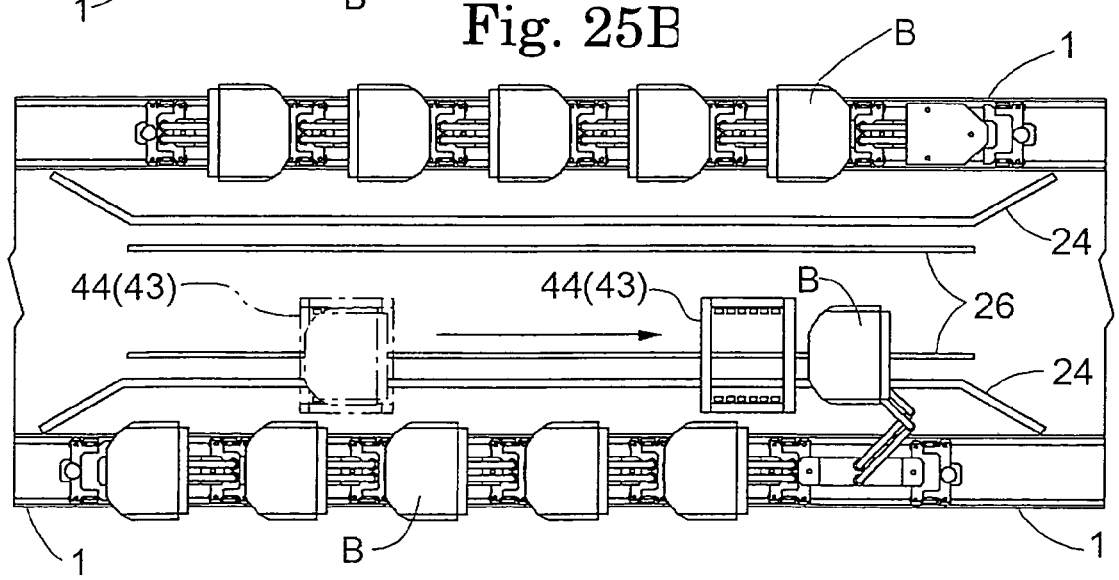

FIG. 23 is a plan view of the main portions of an article transport device in another embodiment. FIG. 24A is a side view of the main portions of the article transport device. FIG. 24B is a front view of the main portions of the article transport device. FIGS. 25A, 25B, and 25C are plan views showing the operation of the article transport device.

At a location in which the endless revolving bodies 1 are opposed to each other and driven to revolve, the article delivering location 3 and the article receiving location 4 that are arranged adjacent to each other in the revolving direction of the endless revolving bodies 1 on the inner side of the endless revolving bodies 1 are combined into one unit. Two such units are arranged along the direction in which the endless revolving bodies 1 are opposed to each other such that the units are positioned corresponding to the endless revolving bodies 1.

The article delivering location 3 and the article receiving location 4 corresponding to the portion in which the endless revolving body 1 revolves from the upper side to the lower side in FIG. 23 are referred to as a third article delivering location 3c and a third article receiving location 4c. The article delivering location 3 and the article receiving location 4 corresponding to the portion in which the endless revolving body 1 revolves from the lower side to the upper side in FIG. 23 are referred to as a fourth article delivering location 3d and a fourth article receiving location 4d.

Taking-out and loading means 43 for taking out an article B supported on the article placing member 2 that is positioned at the away position at the third article delivering location 3c, and for then loading the taken out article B onto the article placing member 2 that is positioned at the away position at the fourth article receiving location 4d is provided. Furthermore, the taking-out and loading means 43 also can take out an article B supported on the article placing member 2 that is positioned at the away position at the fourth article delivering location 3d, and then load the received article B onto the article placing member 2 that is positioned at the away position at the third article receiving location 4c.

The taking-out and loading means 43 is provided with a taking-out and loading roller conveyer 44 that can hold the article placing member 2 for transfer between left and right rollers thereof, and that can transport an article B in a state where both end portions of the article B are placed and supported on the left and right rollers. The taking-out and loading means 43 can move the taking-out and loading roller conveyer 44 in the vertical direction and in the movement direction of the article placing member 2 for transfer that is positioned at the away position in a state where the taking-out and loading roller conveyer 44 is overlapped with a loci of the article placing member 2 in the vertical direction, at the third article delivering location 3c, the third article receiving location 4c, the fourth article delivering location 3d, and the fourth article receiving location 4d. Furthermore, the taking-out and loading means 43 can move the taking-out and loading roller conveyer 44 in a circular manner passing the third article delivering location 3c, the third article receiving location 4c, the fourth article delivering location 3d, and the fourth article receiving location 4d in this order.

Also in this case, the guide rail 24 and the elevation rail 26 are provided, but the elevation rail 26 has a flat shape. More specifically, the elevation rail 26 does not vertically move the article placing member 2 for transfer that is positioned at the away position, and when the taking-out and loading means 43 vertically moves the taking-out and loading roller conveyer 44, an article B is taken out of the article placing member 2 for transfer that is positioned at the away position to the taking-out and loading roller conveyer 44, at the third article delivering location 3c and the fourth article delivering location 3d.

More specifically, a fore-and-aft guide rail 45 that can move the taking-out and loading roller conveyer 44 over the entire length of the third article delivering location 3c and the third article receiving location 4c and over the entire length of the fourth article delivering location 3d and the fourth article receiving location 4d, and a pair of transverse guide rails 47 that can move the taking-out and loading roller conveyer 44 from the third article receiving location 4c to the fourth article delivering location 3d, and from the fourth article receiving location 4d to the third article delivering location 3c are provided.

The fore-and-aft guide rail 45 is provided in a movable manner in the longitudinal direction of the transverse guide rails 47 so as to move between a position corresponding to the third article delivering location 3c and the third article receiving location 4c and a position corresponding to the fourth article delivering location 3d and the fourth article receiving location 4d.

A fore-and-aft reciprocating member 46 that can reciprocate in the longitudinal direction of the fore-and-aft guide rail 45 is provided. The taking-out and loading roller conveyer 44 are suspended and supported by the fore-and-aft reciprocating member 46 in a turnable manner and in a vertically movable manner.

Although not shown, a motor for the guide rail that moves the fore-and-aft guide rail 45 in the longitudinal direction of the transverse guide rails 47, and a reciprocation motor for reciprocating the fore-and-aft reciprocating member 46 in the longitudinal direction of the fore-and-aft guide rail 45, for example, are provided. The fore-and-aft reciprocating member 46 is also provided with a turning motor for turning the taking-out and loading roller conveyer 44.

Hereinafter, the operation of the taking-out and loading means 43 is described in a case where an article B supported on the article placing member 2 that is positioned at the away position is taken out at the third article delivering location 3c, and then the received article B is loaded onto the article placing member 2 that is positioned at the away position at the fourth article receiving location 4d.

When an article B supported on the article placing member 2 for transfer that is positioned at the away position is taken out at the third article delivering location 3c, first, in a state where the fore-and-aft guide rail 45 is at the position corresponding to the third article delivering location 3c and the third article receiving location 4c, the taking-out and loading means 43 puts the taking-out and loading roller conveyer 44 on standby at a movement start position such that the taking-out and loading roller conveyer 44 is positioned below the article B supported on the article placing member 2 for transfer that is positioned at the away position in a state where the taking-out and loading roller conveyer 44 is overlapped with a loci of the article placing member 2 for transfer in the vertical direction. The taking-out and loading means 43 moves the fore-and-aft reciprocating member 46 such that the taking-out and loading roller conveyer 44 is moved in synchronization with the movement of the article placing member 2 for transfer that is positioned at the away position when the article placing member 2 for transfer reaches a position corresponding to the movement start position of the taking-out and loading roller conveyer 44 as shown in FIG. 25A, and raises the taking-out and loading roller conveyer 44 such that the article B supported on the article placing member 2 for transfer that is positioned at the away position is taken out to the taking-out and loading roller conveyer 44, by raising the taking-out and loading roller conveyer 44 from the position below the article B as indicated by the solid line in FIG. 24B.

When the article B is taken out to the taking-out and loading roller conveyer 44 in this manner, as shown in FIG. 25B, the fore-and-aft guide rail 45 is moved from the position corresponding to the third article delivering location 3c and the third article receiving location 4c to the position corresponding to the fourth article delivering location 3d and the fourth article receiving location 4d, and the taking-out and loading roller conveyer 44 is turned by the fore-and-aft reciprocating member 46. Then, the taking-out and loading means 43 loads the article B that is supported by the taking-out and loading roller conveyer 44 onto the article placing member 2 that is positioned at the away position at the fourth article receiving location 4d.

When an article B that is supported by the taking-out and loading roller conveyer 44 is loaded onto the article placing member 2 for transfer that is positioned at the away position at the fourth article receiving location 4d, first, the taking-out and loading means 43 puts the taking-out and loading roller conveyer 44 on standby at a movement start position such that the article B that is supported by the taking-out and loading roller conveyer 44 is positioned above the article placing member 2 for transfer that is positioned at the away position in a state where the article B is overlapped with a loci of the article placing member 2 for transfer in the vertical direction at the fourth article receiving location 4d. When the article placing member 2 for transfer reaches a position corresponding to the movement start position of the taking-out and loading roller conveyer 44, the taking-out and loading means 43 moves the fore-and-aft reciprocating member 46 such that the taking-out and loading roller conveyer 44 is moved in synchronization with the movement of the article placing member 2 for transfer that is positioned at the away position as shown in FIG. 25C, and lowers the taking-out and loading roller conveyer 44 such that the article B that is supported by the taking-out and loading roller conveyer 44 is loaded onto the article placing member 2 that is positioned at the away position, by lowering the article B that is supported by the taking-out and loading roller conveyer 44 from the position above the article placing member 2 that is positioned at the away position as indicated by the broken line in FIG. 24B.

(2) In the first and second embodiments, one guide rail 24 serves as both guide means at the article delivering location 3 and guide means at the article receiving location 4. However, it is also possible to separately provide the guide rail 24 corresponding to the article delivering location 3 and the guide rail 24 corresponding to the article receiving location 4 while arranging the article delivering location 3 and the article receiving location 4 spaced away from each other in the revolving direction of the endless revolving body 1, for example.

(3) In the first and second embodiments, the receiving roller conveyer 28 as the article-receiving placing portion 22 installed at the article delivering location 3 is provided, and the article placing member 2 for transfer that is positioned at the away position at the article delivering location 3 is vertically moved along the elevation rail 26, so that an article B is delivered from the article placing member 2 for transfer to the receiving roller conveyer 28. However, without vertically moving the article placing member 2 for transfer that is positioned at the away position at the article delivering location 3, it is also possible to take out an article B from the article placing member 2 for transfer to the article-receiving placing portion, installed at the article delivering location 3 by vertically moving the article-receiving placing portion. In this case, for example, as described in Other Embodiment (1), the taking-out and loading means 43 that is provided with the taking-out and loading roller conveyer 44 in a vertically movable manner is installed at the article delivering location 3.

(4) In the first and second embodiments, the receiving roller conveyer 28 (article-receiving placing portion 22) is installed at the article delivering location 3, and the article delivering means 23 that is provided with the delivering roller conveyer 35 is installed at the article receiving location 4. However, as described in Other Embodiment (1), the taking-out and loading means 43 that is provided with the taking-out and loading roller conveyer 44 in a vertically movable manner may be installed in a reciprocatable manner over the entire length of the article delivering location 3 and the article receiving location 4, for example.

(5) In the first and second embodiments, the article-receiving placing portion 22 is constituted by the receiving roller conveyer 28 on which a plurality of articles B can be placed between the article delivering location 3 and the article take-out location 27. However, the configuration of the article-receiving placing portion 22 can be changed as appropriate, and for example, a placing stage on which both end portions of articles B are placed and supported may be provided as the article-receiving placing portion 22.

(6) In the first and second embodiments, the support means for moving the article placing member is constituted by the elevation support means 13 for supporting the article placing member 2 in a vertically movable manner, and the second means 14 for supporting the elevation support means 13 in a movable manner with respect to the endless revolving body 1 such that the article placing member 2 can be moved between the transport position and the away position with respect to the endless revolving body 1. However, one support means may support the article placing member 2 such that the article placing member 2 can vertically move and can move between the transport position and the away position with respect to the endless revolving body 1, for example. The configuration of the support means for moving the article placing member may be changed as appropriate.

(7) In the first and second embodiments, the guide means 21 is constituted by the guide rail 24 that guides the horizontal guide roller 20 and the elevation rail 26 that guides the elevation guide roller 25. However, the guide means 21 may be constituted by one guide rail, for example. The configuration of the guide means 21 may be changed as appropriate.

(8) In the first and second embodiments, the endless revolving body 1 is constituted by the plurality of travel members 6 and the plurality of coupling members 7 that couple the travel members 6. However, the endless revolving body 1 may be constituted by a cyclic belt body that revolves in a circular manner, for example. The configuration of the endless revolving body 1 may be changed as appropriate.

(9) It is not always necessary to couple the plurality of travel members 6 (vehicles).

(10) In the first and second embodiments, the away position is a position spaced away from the transport position in the horizontal direction. However, the away position may be any position as long as it is a position outside the article-transporting space that is occupied by articles B that are placed and supported on the article placing members 2 at the transport positions as the transportation progresses. The away position may be changed as appropriate with respect to the transport position.

For example, the away position may be a position spaced away from the transport position to the upper side. In this case, the guide means may be configured so as to guide the article placing member 2 for transfer such that the article placing member 2 for transfer is raised from the transport position to the away position and is lowered from the away position to the transport position at the article delivering location or the article receiving location, and to vertically move the article placing member 2 for transfer at the away position at the article delivering location such that an article B supported on the article placing member 2 for transfer that is positioned at the away position is delivered from the article placing member 2 for transfer to the article-receiving placing portion, by lowering the article B from the position above the article-receiving placing portion at the article delivering location.

What is claimed is:

1. An article transport device, comprising:
   an endless revolving body that is configured to move along a cyclic path in a substantially horizontal direction;
   a plurality of article supports each of which supports an article, wherein the article supports move together with the endless revolving body with the supports spaced apart from each other in a traveling direction;
   support means for supporting the article supports to the endless revolving body such that the article supports can move between a transport position adjacent the endless revolving body and an away position spaced apart from the transport position, said support means supporting the article supports at both said transport position and said away position such that the article supports can move together with said endless revolving body; and
   guide means for causing at least some of the article supports to move from the transport position to the away position and to move from the away position to the transport position, at an article delivering location or an article receiving location along the cyclic path of the endless revolving body, said guide means being provided independently of said endless revolving body.

2. The article transport device according to claim 1, further comprising:
   an article-receiving placing portion, installed at the article delivering location, that receives an article from the article support that is positioned at the away position at the article delivering location;
   wherein the support means is configured to vertically movably support the article support with respect to the endless revolving body in order to deliver an article, and
   the guide means causes the article support that is positioned at the away position at the article delivering location to vertically move such that an article supported by the article support is delivered to the article-receiving placing portion, by lowering the article from a position above the article-receiving placing portion.

3. The article transport device according to claim 2, wherein the article-receiving placing portion has article-placing transport means for transporting an article at the article delivering location in a substantially horizontal direction toward an article take-out location, and for placing a plurality of articles between the article delivering location and the article take-out location.

4. The article transport device according to claim 3, wherein the support means has first means for vertically movably supporting the article support, and second means for supporting the first means in a movable manner with respect to the endless revolving body such that the article support is supported to be movable between the transport position and the away position with respect to the endless revolving body.

5. The article transport device according to claim 1, wherein the support means has first means for vertically movably supporting the article support, and second means for supporting the first means in a movable manner with respect to the endless revolving body such that the article support is supported to be movable between the transport position and the away position with respect to the endless revolving body.

6. The article transport device according to claim 5, wherein the guide means has a movement guide member that guides the article support such that the article support is moved between the transport position and the away position, and an elevation guide member that guides the article support such that the article support positioned at the away position at the article delivering location is vertically moved.

7. The article transport device according to claim 6, wherein the elevation guide member has an elevation rail, and the elevation rail has an upward portion that is inclined upward, a flat middle portion, and a downward portion that is inclined downward in a side view.

8. The article transport device according to claim 5, wherein the second means has at least one first link arm that is pivotably attached to the endless revolving body, and at least one second link arm that is pivotably attached to the first link arm.

9. The article transport device according to claim 8, wherein the first means has a base member that is supported by the second link arm, and at least one elevation link arm having one end supported by the base member pivotably in the vertical direction and the other end supported by the article support pivotably in the vertical direction.

10. The article transport device according to claim 1, further comprising:
    article delivering means installed at the article receiving location, for delivering an article supported by an article-delivering placing portion to the article support that is positioned at the away position at the article receiving location,
    wherein the article delivering means causes the article-delivering placing portion to move in synchronization with movement of the article support that is positioned at the away position at the article receiving location, and the article-delivering placing portion to vertically move such that an article supported by the article-delivering placing portion is delivered to the article support, by lowering the article from a position above the article support that is positioned at the away position at the article receiving location.

11. The article transport device according to claim 1, wherein the endless revolving body is driven by a linear motor having magnets and coils.

12. The article transport device according to claim 1, wherein the article support has, on a surface thereof, a positioning member extending in the vertical direction for fixing the position of an article.

13. An article transport device, comprising:
a plurality of vehicles that are configured to move along a closed path;
an article support supported by at least some of the vehicles, for supporting an article;
a link mechanism for supporting the article support with respect to the vehicle such that the article support can move between a transport position adjacent corresponding one of the vehicles and an away position spaced apart from the transport position, said link mechanism supporting the article supports at both said transport position and said away position such that the article supports can move together with said vehicles; and
a guide that causes the article support to move between the away position and the transport position, said guide being provided independently of said vehicles.

14. The article transport device according to claim 13, wherein the plurality of vehicles are coupled to each other so as to form an endless body.

15. The article transport device according to claim 13, further comprising:
a receiving member that has a support face disposed so as to receive an article supported by the article support when the article support is at the away position.

16. The article transport device according to claim 15, wherein the receiving member is a roller conveyer having a plurality of rollers, and circumferential faces of the plurality of rollers form the support face.

17. The article transport device according to claim 15, further comprising:
an inclined face provided on an area of the receiving member, for raising an upper face of the article support to a position above the support face.

18. The article transport device according to claim 13, further comprising:
an elevation link that is provided between the link mechanism and the article support, and that allows the article support to be vertically displaced with respect to the link mechanism.

19. The article transport device according to claim 13, further comprising:
a linear motor mechanism having magnets and coils, for driving the vehicles.

20. The article transport device according to claim 13, wherein the guide is a guide rail that receives a guide roller that is operatively coupled into the article support.

* * * * *

UNITED STATES PATENT AND TRADEMARK OFFICE
CERTIFICATE OF CORRECTION

PATENT NO.        : 7,648,018 B2
APPLICATION NO. : 11/499242
DATED             : January 19, 2010
INVENTOR(S)       : Yoshitaka Inui It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 742 days.

Signed and Sealed this

Sixteenth Day of November, 2010

David J. Kappos
*Director of the United States Patent and Trademark Office*